(12) United States Patent
Mano et al.

(10) Patent No.: US 6,373,232 B1
(45) Date of Patent: Apr. 16, 2002

(54) POWER SUPPLY DEVICE FOR IMAGE FORMING APPARATUS, AND IMAGE FORMING APPARATUS USING THE SAME

(75) Inventors: Hiroshi Mano; Minoru Hayasaki, both of Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/705,727

(22) Filed: Nov. 6, 2000

(30) Foreign Application Priority Data

Nov. 11, 1999 (JP) ............................................. 11-321205
Oct. 31, 2000 (JP) ......................................... 2000-333339

(51) Int. Cl.[7] ............................. G05F 1/40; G03G 15/00
(52) U.S. Cl. ......................... 323/282; 219/216; 399/334
(58) Field of Search ................................ 323/282, 285, 323/222, 272; 399/334, 335, 45; 363/89, 97, 98, 80, 81; 219/216

(56) References Cited

U.S. PATENT DOCUMENTS

| | | | |
|---|---|---|---|
| 5,083,168 A | 1/1992 | Kusaka et al. | 355/285 |
| 5,149,941 A | 9/1992 | Hirabayashi et al. | 219/216 |
| 5,210,579 A | 5/1993 | Setoriyama et al. | 355/285 |
| 5,525,775 A | 6/1996 | Setoriyama et al. | 219/216 |
| 5,771,164 A * | 6/1998 | Murai et al. | 363/89 |
| 5,801,359 A | 9/1998 | Mano et al. | 219/667 |
| 5,819,150 A | 10/1998 | Hayasaki et al. | 399/330 |
| 5,940,655 A | 8/1999 | Sano et al. | 399/69 |

FOREIGN PATENT DOCUMENTS

| | | |
|---|---|---|
| JP | 63-313182 | 12/1988 |
| JP | 2-157878 | 6/1990 |
| JP | 4-44075 | 2/1992 |
| JP | 4-204980 | 7/1992 |

* cited by examiner

Primary Examiner—Rajnikant B. Patel
(74) Attorney, Agent, or Firm—Fitzpatrick, Cella, Harper & Scinto

(57) ABSTRACT

This invention provides a power supply device which widens a narrow output control width which is a drawback of a conventional voltage resonant power supply, and in adopting as a switching control element a low-cost IGBT (Insulated Gate Bipolar Transistor) which permits a large current, optimizes a gate signal waveform to minimize a switching loss in control because the IGBT has a larger loss than an FET. A voltage resonant converter includes a switching IGBT (201) connected to a power supply, a first resonant capacitor (204) series-connected to the IGBT (201), an IGBT (202) series-connected to the first resonant capacitor (204), an exciting coil (18) connected between the power supply and a node between the first resonant capacitor (204) and the IGBT (202), a second resonant capacitor (205) parallel-connected to the IGBT (202), and regenerative diodes (206, 207) respectively parallel-connected to the IGBTs (201, 202). A gate control signal to the IGBTs (201, 202) allows generating a switching timing signal by waveform shaping from a transmission voltage (3) of an insulated driving transformer to ensure reliable switching operation.

31 Claims, 22 Drawing Sheets

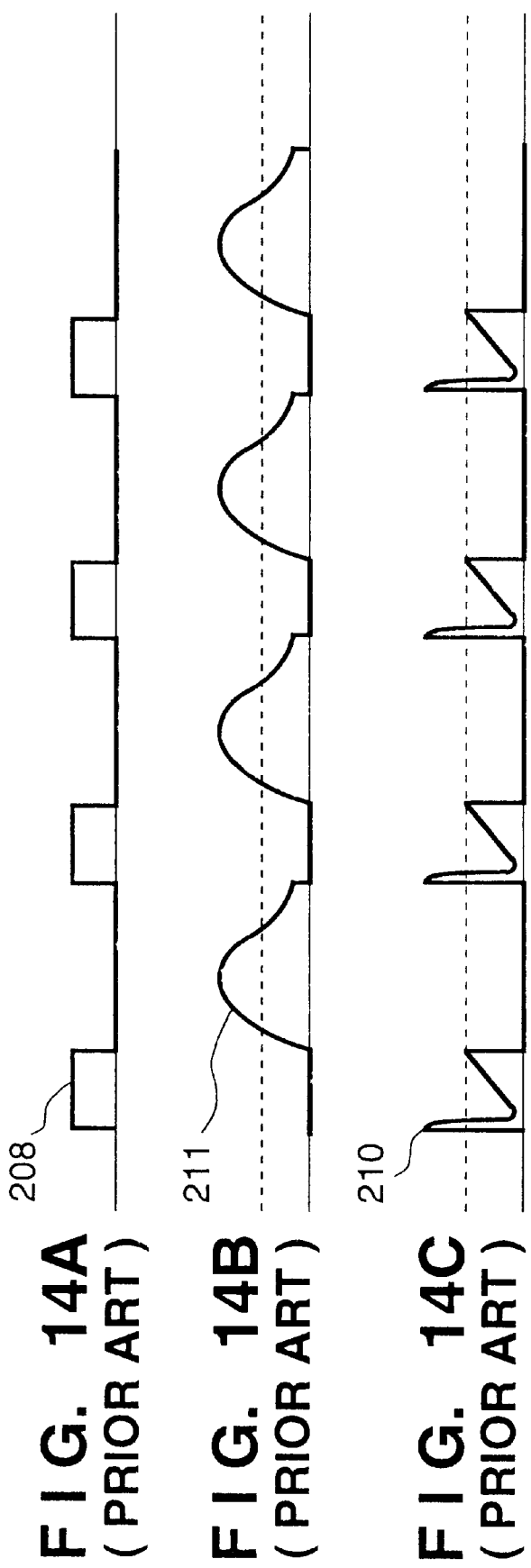

208 A B  C  D E

209

210

211

212

213

214

215

216

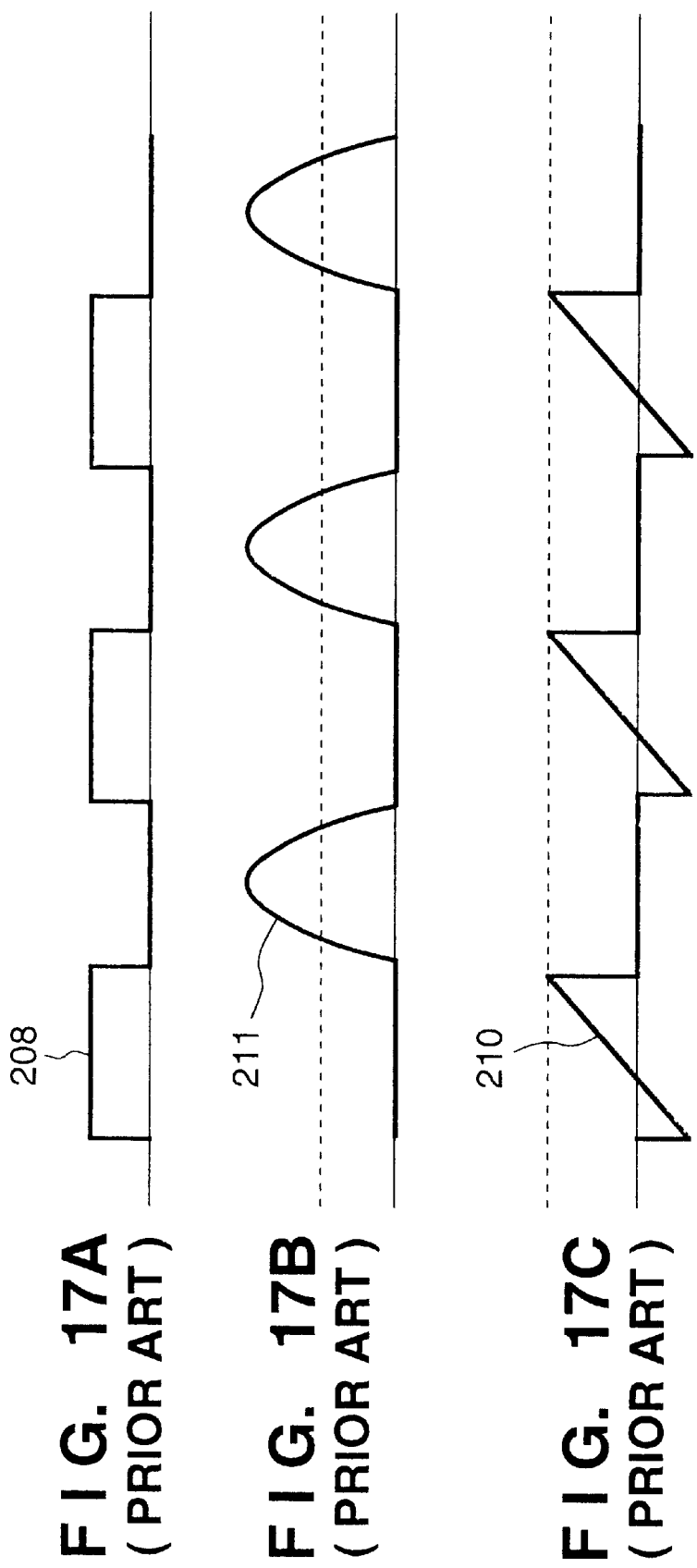

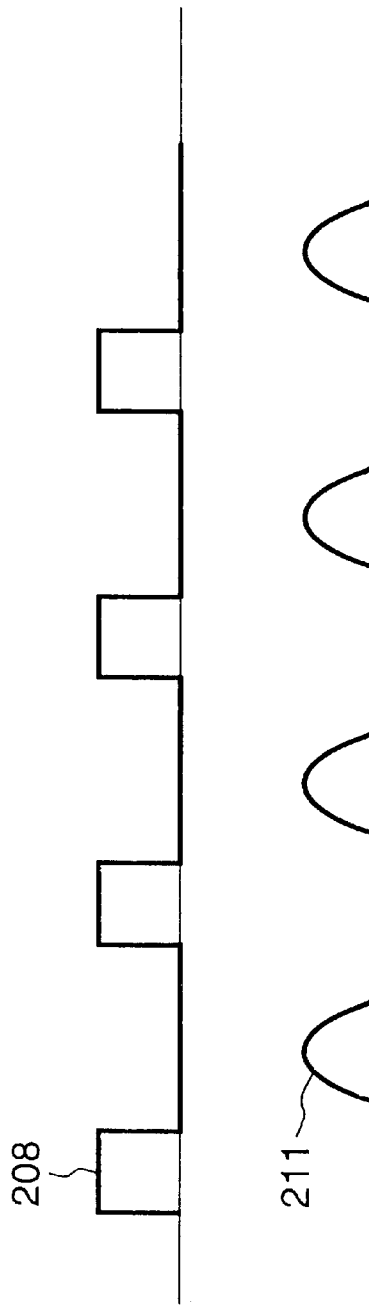
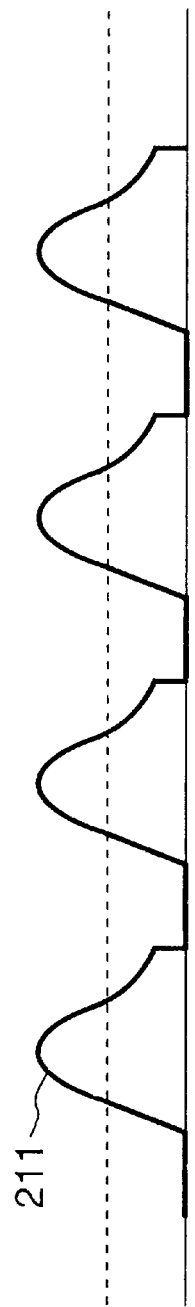
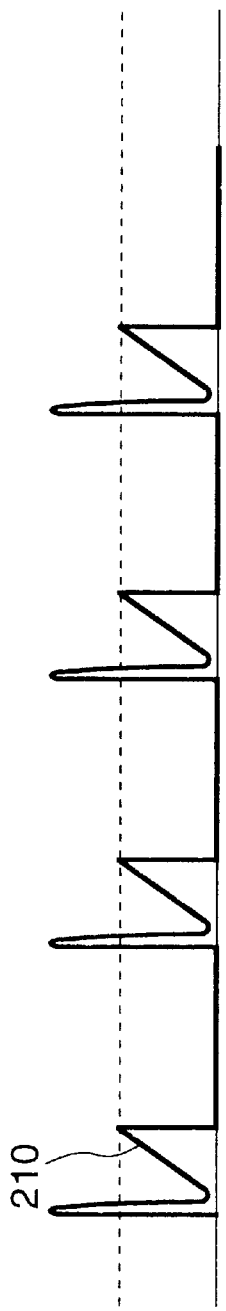
FIG. 18A (PRIOR ART)
FIG. 18B (PRIOR ART)
FIG. 18C (PRIOR ART)

POWER SUPPLY DEVICE FOR IMAGE FORMING APPARATUS, AND IMAGE FORMING APPARATUS USING THE SAME

FIELD OF THE INVENTION

The present invention relates to a power supply device and an image forming apparatus using the same and, more particularly, to a belt heating type heating device, a power supply device which can be preferably used for an image forming apparatus such as an electrophotographic apparatus or electrostatic recording apparatus having the heating device as an image heating device, and an image forming apparatus using the same.

BACKGROUND OF THE INVENTION

Conventionally, there is an image heating device mounted in an image forming apparatus or the like. For descriptive convenience, the prior art will exemplify an image heating device which is mounted in an image forming apparatus such as a copying machine or printer, and heats and fixes a toner image to a printing medium.

Image forming apparatuses widely use heated roller type devices as fixing devices for heating and fixing, as permanently fixed images to the surfaces of printing media, unfixed images (toner images) of target image information formed on and carried by the printing media (transfer sheets, electrofax sheets, electrostatic transfer printing paper, OHP sheets, printing paper, format paper, and the like) by a transfer method or direct method with proper image forming process means such as an electrophotographic process, electrostatic transfer printing process, and magnetic transfer printing process. Recently, belt heating type devices are becoming commercially available in terms of quick start and energy saving. Also, electromagnetic induction heating type devices are proposed. Various fixing devices in image forming apparatuses will be explained.

(a) Heated Roller Type Fixing Device

A heated roller type fixing device is basically constituted by a pair of urging rollers, i.e., a fixing roller (heating roller) and press roller. The pair of rollers are rotated, and a printing medium on which an unfixed toner image to be fixed is formed and carried is introduced, clamped, and conveyed at a fixing nip portion as an urging portion between the pair of rollers. The unfixed toner image is fused and fixed to the surface of the printing medium by heat of the fixing roller and the applied pressure at the fixing nip portion.

In general, the fixing roller uses an aluminum hollow metal roller as a base (core metal), and a halogen lamp as a heat source is inserted in the hollow portion. The fixing roller is heated by heat generated by the halogen lamp, and adjusted in temperature by controlling power to the halogen lamp so as to maintain the outer surface at a predetermined fixing temperature.

Particularly in the fixing device of an image forming apparatus for forming a full-color image which has to have an ability of sufficiently heating and fusing a toner image of four layers at maximum and mixing colors, the fixing roller incorporates a core metal having a large thermal capacity, the core metal is covered with an elastic rubber layer for covering a toner image and uniformly fusing it, and a toner image is heated via the elastic rubber layer. In addition, the pressuring roller also incorporates a heat source, and is heated and adjusted in temperature.

In the heated roller type fixing device, however, even if the power supply of the image forming apparatus is turned on to simultaneously start energizing the halogen lamp serving as the heat source of the fixing device, the thermal capacity of the fixing roller is large, and it requires a long wait time to heat the fixing roller or the like from a cold state to a predetermined fixable temperature, which impairs quick start. The halogen lamp must be energized to maintain the fixing roller in a predetermined temperature-adjusted state so as to execute image formation operating at any time even in the standby state (no image output state) of the image forming apparatus, which increases the power consumption amount.

Especially in a fixing device using a fixing roller having a large thermal capacity, such as the fixing device of the full-color image forming apparatus, a delay occurs between temperature adjustment and temperature rise on the surface of the fixing roller. This causes problems such as a fixing failure, gloss nonuniformity, and offset.

(b) Film Heating Type Fixing Device

Film heating type fixing devices are disclosed in, e.g., Japanese Patent Laid-Open Nos. 63-313182, 2-157878, 4-44075, and 4-204980.

More specifically, a nip portion is formed by clamping a heat-resistant film (fixing film) between a ceramic heater serving as a heating member and a press roller serving as a press member. A printing medium on which an unfixed toner image to be fixed is formed and carried is introduced between the film and the press roller at the nip portion, and clamped and conveyed together with the film. At the nip portion, heat of the ceramic heater is applied to the printing medium via the film, and the unfixed toner image is fused and fixed to the surface of the printing medium by a pressure applied to the nip portion.

The film heating type fixing device can constitute an on-demand type apparatus using a ceramic heater and a low-heat-capacity member serving as a film. Only when the image forming apparatus is to execute image formation, the ceramic heater as a heat source is energized to generate a predetermined fixing temperature. The wait time from power-on of the image forming apparatus to an image formation executable state is short (quick start), and the power consumption in a standby state is very low (power saving). However, this type of fixing device is insufficient in heat quantity as a fixing device for a full-color image forming apparatus or high-speed machine which requires a large heat quantity.

(c) Electromagnetic Induction Heating Type Fixing Device

Japanese Utility Model Laid-Open No. 51-109739 discloses an induction heating/fixing device for inducing a current in a fixing roller by a magnetic flux and generating heat by Joule heat. The fixing roller can directly generate heat by using generation of an induced current, and this fixing device achieves a fixing process with higher efficiency than in a heated roller type fixing device using a halogen lamp as a heat source.

However, since the energy of an alternating flux generated by an exciting coil serving as a magnetic field generation means is used by temperature rise of the whole fixing roller, the heat dissipation loss is large, and the fixing energy density with respect to applied energy is low, resulting in low efficiency.

For this reason, a high-efficiency fixing device is devised by arranging an exciting coil near a fixing roller serving as a heat generation member, or concentrating the alternating flux distribution of the exciting coil in the vicinity of a fixing nip portion in order to obtain energy acting for fixing at high density.

A schematic arrangement of an electromagnetic induction heating type fixing device which concentrates the alternating flux distribution of an exciting coil to a fixing nip portion to attain high efficiency will be described with reference to FIG. 3 used in embodiments of the present invention (to be described later) for descriptive convenience.

In FIG. 3, reference numeral 10 denotes a cylindrical fixing film serving as an electromagnetic induction heat generation rotary member having an electromagnetic induction heat generation layer (conductive layer, magnetic layer, and resistive layer); and 16a and 16b, film guide (belt guide) members whose cross section has an almost arcuated groove shape. The cylindrical fixing film 10 is loosely fitted on the outer surface of the film guide members 16a and 16b. An exciting coil 18 and E-shaped magnetic core (core member) 17, each of which is arranged inside the film guide members 16a and 16b, comprise a magnetic field generation means; and 30, an elastic press roller which forms a fixing nip portion N having a predetermined width with a predetermined applied pressure together with the lower surface of the film guide members 16a and 16b via the fixing film 10, and is urged against the film guide members 16a and 16b. The magnetic core 17 of the magnetic field generation means 15 is positioned in correspondence with the fixing nip portion N.

The press roller 30 is rotated by a driving means M counterclockwise indicated by an arrow. A rotational force acts on the fixing film 10 by the frictional force between the press roller 30 and the outer surface of the fixing film 10 that is generated by rotation of the press roller 30. While the inner surface of the fixing film 10 slides in tight contact with the lower surface of the film guide members 16a and 16b at the fixing nip portion N, the fixing film 10 rotates on the outer surface of the film guide members 16a and 16b clockwise indicated by an arrow at a peripheral speed substantially corresponding to the rotational peripheral speed of the press roller 30 (press roller driving method).

The film guide members 16a and 16b pressurize the fixing nip portion N, supports the exciting coil 18 and magnetic core 17 serving as the magnetic field generation means 15, supports the fixing film 10, and stabilizes conveyance of the fixing film 10 in rotation. The film guide members 16a and 16b is an insulating member which does not inhibit permeation of a magnetic flux, and is made of a material which can bear a heavy load.

The exciting coil 18 generates an alternating flux by an alternating current supplied from an exciting circuit (not shown). The alternating flux is concentratedly distributed at the fixing nip portion N by the E-shaped magnetic core 17 corresponding to the position of the fixing nip portion N. The alternating flux generates an eddy current in the electromagnetic induction heat generation layer of the fixing film 10 at the fixing nip portion N. The eddy current generates Joule heat in the electromagnetic induction heat generation layer by the specific resistance of the electromagnetic induction heat generation layer.

Electromagnetic induction heat generation of the fixing film 10 concentratedly occurs at the fixing nip portion N where the alternating flux is concentratedly distributed, and the fixing nip portion N is heated at high efficiency. The temperature of the fixing nip portion N is adjusted to maintain a predetermined temperature by controlling current supply to the exciting coil 18 by a temperature adjustment system including a temperature detection means (not shown).

As the press roller 30 is rotated, the cylindrical fixing film 10 rotates on the outer surface of the film guide members 16a and 16b. Power is supplied from the exciting circuit to the exciting coil 18 to cause electromagnetic induction heat generation of the fixing film 10. The temperature of the fixing nip portion N rises to a predetermined temperature and is adjusted. In this state, a printing medium P which is conveyed from an image formation means (not shown) and has an unfixed toner image t is introduced between the fixing film 10 and the press roller 30 at the fixing nip portion N with an image surface facing up, i.e., facing the fixing film surface. The image surface comes into tight contact with the outer surface of the fixing film 10 at the fixing nip portion N, and the printing medium P is clamped and conveyed together with the fixing film 10 at the fixing nip portion N.

While the printing medium P is clamped and conveyed together with the fixing film 10 at the fixing nip portion N, the printing medium P is heated by heat generated by electromagnetic induction of the fixing film 10 to heat and fix the unfixed toner image t on the printing medium P. After the printing medium P passes through the fixing nip portion N, the printing medium P is separated from the outer surface of the rotating fixing film 10, and discharged and conveyed.

Inverter circuits used in the electromagnetic induction heating power supply having this arrangement are roughly classified into circuits having a current resonance type power supply method and voltage resonance type power supply method. The resonance method is used to positively generate the vibration state of a voltage or current generated in switching, and switch a switching element when either or both of the voltage and current are low, in order to reduce the loss of a conversion switching element at relatively large power. This method is called soft switching which is the most effective method at large power, and various methods are proposed.

FIG. 16 shows a voltage resonance type inverter circuit as a prior art. In FIG. 16, reference numeral 202 denotes a switching element; 203, a resonant coil (exciting coil); and 205, a resonant capacitor. A known voltage resonance inverter operates such that the switching element 202 is turned on to accumulate power in the resonant coil 203, then the switching element 202 is turned off, and the voltage starts vibration while drawing a resonant arc in a cycle determined by the constants of the resonant coil 203 and resonant capacitor 205. The state at this time is shown in FIGS. 17A, 17B, and 17C.

FIGS. 18A to 18C show operation waveforms when power conversion operation is done by reducing the ON width of a gate switching signal in order to narrow down output power. The voltage waveform of the switching element 202 upon narrowing down output power draws a sine wave which resonates and attenuates with reference to a power supply voltage (level represented by a broken line) connected to the terminal of the resonant coil 203. The vibration amplitude of the voltage depends on exciting power accumulated in the resonant coil (exciting coil) 203, i.e., the ON width of the switching element 202. In power saving, the vibration amplitude is small, the voltage does not satisfactorily drop from the power supply voltage level, and no zero-crossing point is obtained.

More specifically, the switching element 202 switches the load of a very low impedance of the resonant capacitor 205 via the power supply line, and an excessive current flows in switching-on operation. The range where this excessive current does not destruct the switching element 202 can only be narrowed down to about $\frac{1}{3}$ the maximum output in the voltage resonant power supply. This makes the design difficult.

However, the above-mentioned prior art suffers the following problem. That is, the mainstream of the required width of a power control region used in a fixing/heating device mounted in an image forming apparatus is 1,100 W to 150 W. Of the current resonant method and voltage resonant method as the induction heating power supply proposed by the present application, the voltage resonant method which can be realized with a simple arrangement is more popular.

However, power control in the conventional voltage resonant method can only narrow down power to about ⅓ the maximum output, i.e., up to 350 W in the above example. If power is to be narrowed down much more, power deviates from the voltage resonant state, and a large current flows through the switching element to destruct it.

If fixing control is done using this power supply in the image forming apparatus, power is excessive at 350 W in the temperature saturation state in continuous printing, and the circuit intermittently operates. This intermittent operation control causes unstable temperature operation. In addition, the voltage resonant circuit is under the load of the parallel circuit of the resonant capacitor and coil, so that an excessive current flows in activation to apply stress to the switching element.

SUMMARY OF THE INVENTION

The present invention has been made in consideration of the above situation, and has as its object to provide a power supply device and voltage resonant method which can widen a narrow output control width which is a drawback of a conventional voltage resonant power supply, and can optimize a gate signal waveform to minimize a switching loss in control, which is particularly suitable in adopting as a switching control element a low-cost IGBT (Insulated Gate Bipolar Transistor) which permits a large current, but has a larger loss than an FET.

To achieve the above object, a power supply device for an image forming apparatus according to the present invention is characterized by comprising a first IGBT (Insulated Gate Bipolar Transistor) connected to a power supply, first electricity accumulation means series-connected to the first IGBT, a second IGBT series-connected to the first electricity accumulation means, magnetic field generation means connected between the power supply and a node between the first electricity accumulation means and the second IGBT, second electricity accumulation means parallel-connected to the second IGBT, first rectifying means parallel-connected to the first IGBT, voltage resonant converter means having second rectifying means parallel-connected to the second IGBT, and insulated driving circuit means for shaping a waveform of a transmission voltage transmitted via an output terminal of an insulated transformer, and outputting the transmission voltage as a driving voltage for driving gates of the first and second IGBTs, the insulated driving circuit means having threshold voltage generation means for generating a preset threshold voltage, detection means for detecting that the transmission voltage becomes lower than the threshold voltage when the transmission voltage drops, and first switching means for short-circuiting output terminals of the insulated transformer in response to the detection.

The object also achieved by a power supply device comprising: an alternating current power supply; a rectifier rectifying alternating current generated from said alternating current power supply; a detecting circuit detecting the output voltage of said alternating current power supply; an IGBT (Insulated Gate Bipolar Transistor) switching by the output of said rectifier; and a switching means for short-circuiting the output of said rectifier based on the voltage detected by said detecting circuit.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 14A to 14C are waveform charts showing operation waveforms in a conventional voltage resonant converter to be compared with the first embodiment of the present invention;

FIGS. 17A to 17C are waveform charts showing waveforms when the voltage starts vibration while drawing a resonant arc in a cycle determined by the constants of a resonant coil and resonant capacitor according to the prior art;

FIGS. 18A to 18C are waveform charts showing waveforms when power conversion operation is done by reducing the ON width of a gate switching signal in order to narrow down output power according to the prior art;

DETAILED DESCRIPTION OF THE PREFERRED EMBODIMENTS

Preferred embodiments of the present invention will now be described in detail in accordance with the accompanying drawings.

(First Embodiment)

(1) Image Forming Apparatus

Figure 2:
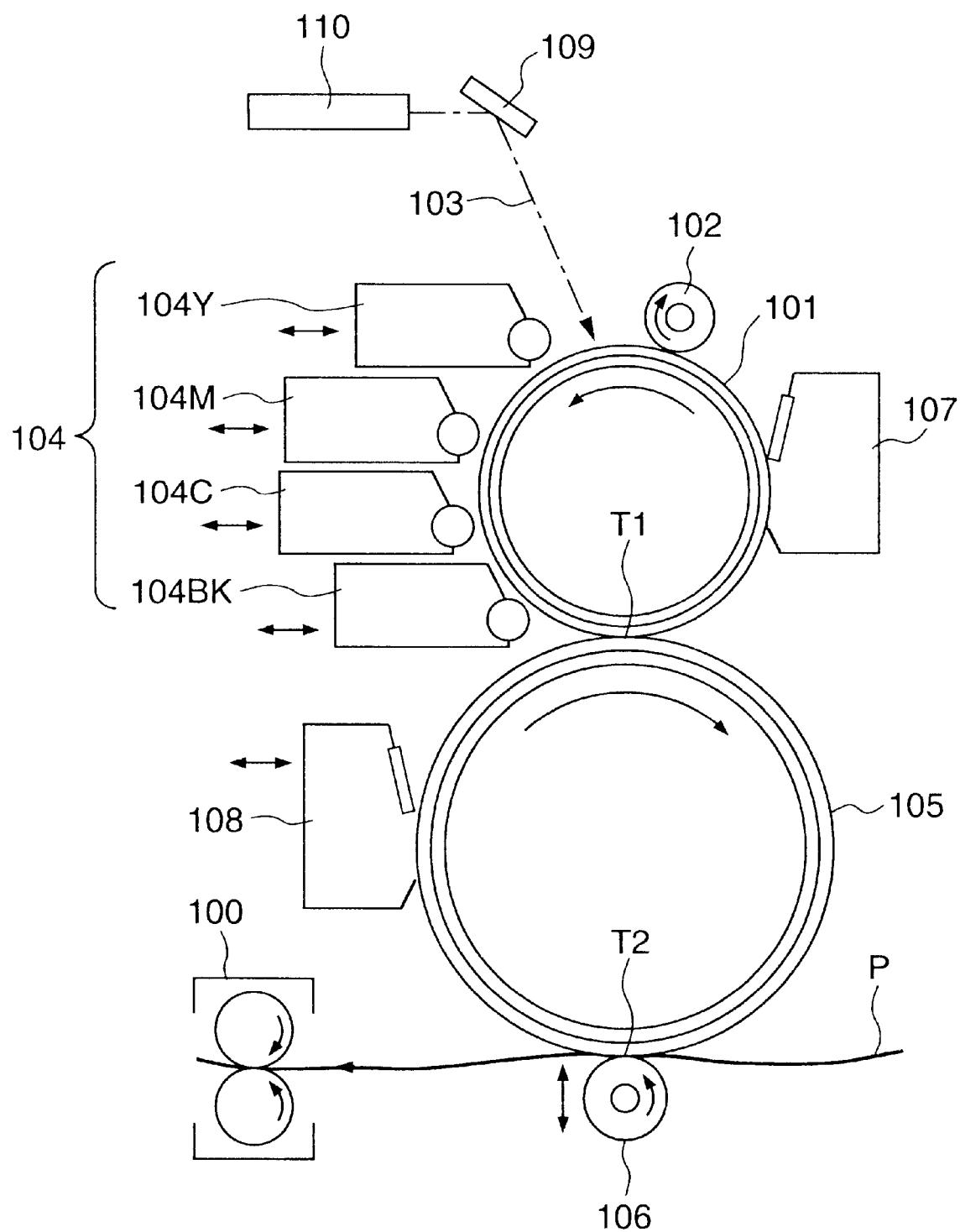
FIG. 2 is a view showing an arrangement of an image forming apparatus to which the power supply device of the present invention can be applied.

An example of an image forming apparatus to which a power supply device according to the present invention is applied will be described. FIG. 2 is a view showing the arrangement of the image forming apparatus according to the first embodiment of the present invention. The first embodiment will exemplify an electrophotographic color printer as an image forming apparatus, but is not limited to this. The image forming apparatus comprises a fixing device (image heating device) 100, photosensitive drum (image carrier) 101, charging device 102, 4-color developing device 104, intermediate transfer drum 105, transfer roller 106, cleaner 107, mirror 109, and laser optical box (laser scanner) 110.

The arrangements of the respective portions will be described in detail together with their operations. The photosensitive drum (image carrier) 101 is made of an organic photosensitive material or amorphous silicon photosensitive material, and rotated at a predetermined process speed (peripheral speed) counterclockwise indicated by an arrow. During rotation, the photosensitive drum 101 is uniformly charged with a predetermined polarity at a predetermined potential by the charging device 102 such as a charging roller. Then, the photosensitive drum 101 undergoes scanning/exposure processing of target image information on a surface to be charged by a laser beam 103 output from the laser optical box 110. The laser optical box 110 outputs the laser beam 103 modulated (on/off) in correspondence with a time-series electrical digital pixel signal of target image information from an image signal generation device (not shown) such as an image reading device, and forms an electrostatic latent image corresponding to the target image information exposed by scanning the surface of the photosensitive drum 101 during rotation. The mirror 109 deflects the laser beam output from the laser optical box 110 to an exposure position on the photosensitive drum 101.

For a full-color image, the first color-separated component image of a target full-color image, e.g., yellow component image is formed into a latent image by scanning and exposure. This latent image is developed as a yellow toner image by the operation of a yellow developing unit 104Y of the 4-color developing device 104. The yellow toner image is transferred to the surface of the intermediate transfer drum 105 at a primary transfer portion T1 serving as the contact portion (or vicinity portion) between the photosensitive drum 101 and the intermediate transfer drum 105. After the toner image is transferred to the surface of the intermediate transfer drum 105, the surface of the rotating photosensitive drum 101 is cleaned by removing an attaching residue such as toner remaining after transfer by the cleaner 107.

The process cycle of charging, scanning/exposure, developing, primary transfer, and cleaning is sequentially executed for the second color-separated component image (e.g., magenta component image; a magenta developing unit 104M operates), third color-separated component image (e.g., cyan component image; a cyan developing unit 104C operates), and fourth color-separated component image (e.g., black component image; a black developing unit 104BK operates) of the target full-color image. As a result, the yellow toner image, magenta toner image, cyan toner image, and black toner image, i.e., a total of four color toner images are sequentially transferred over previous images on the surface of the intermediate transfer drum 105, thereby synthesizing and forming a color toner image corresponding to the target full-color image.

The intermediate transfer drum 105 has an intermediate-resistance elastic layer and high-resistance surface layer on a metal drum. The intermediate transfer drum 105 is rotated clockwise indicated by an arrow at almost the same peripheral speed as the photosensitive drum 101 in contact with or near the photosensitive drum 101. A bias potential is applied to the metal drum of the intermediate transfer drum 105 to transfer a toner image on the photosensitive drum 101 to the surface of the intermediate transfer drum 105 using a potential difference from the photosensitive drum 101.

The color toner image synthesized and formed on the surface of the rotating intermediate transfer drum 105 is transferred at a secondary transfer portion T2 serving as a contact nip portion between the rotating intermediate transfer drum 105 and the transfer roller 106 to a printing medium P fed from a paper feed portion (not shown) to a secondary transfer portion T2 at a predetermined timing. The transfer roller 106 supplies electric charges of opposite polarity to that of toner from the back surface of the printing medium P, thereby sequentially transferring the synthesized color toner image at once from the surface of the intermediate transfer drum 105 to the printing medium P. The printing medium P having passed through the secondary transfer portion T2 is separated from the surface of the intermediate transfer drum 105, and introduced into the fixing device (image heating device) 100 where the unfixed toner image is heated and fixed. Then, the printing medium P is discharged as a color image print to an outer delivery tray (not shown). The fixing device (image heating device) 100 will be described in detail in article (2).

The rotating intermediate transfer drum 105 after the color toner image is transferred to the printing medium P is cleaned in the above manner by removing an attaching residue such as toner remaining after transfer, paper dust, or the like by the cleaner 107. The cleaner 107 is normally held in non-contact with the intermediate transfer drum 105, and is held in contact with the intermediate transfer drum 105 during the secondary transfer execution process of a color toner image from the intermediate transfer drum 105 to the printing medium P. Also, the transfer roller 106 is normally held in non-contact with the intermediate transfer drum 105, and is held in contact with the intermediate transfer drum 105 via the printing medium P during the secondary transfer execution process of a color toner image from the intermediate transfer drum 105 to the printing medium P.

The image forming apparatus of the first embodiment can execute a printing mode of a monochrome color image such as a black & white image. This apparatus can also execute a double-sided image printing mode or multiple image printing mode. In the double-sided printing mode, a printing medium P which is output from the fixing device (image heating device) 100 and has an image of one side is turned over via a re-circulation convey mechanism (not shown), and fed to the secondary transfer portion T2 again where a toner image is transferred to the other side. The printing medium P is introduced into the fixing device (image heating device) 100 again where the toner image on the other side is fixed, and a double-sided image print is output.

In the multiple image printing mode, a printing medium P which is output from the fixing device (image heating device) 100 and has an image of one side is fed to the secondary transfer portion T2 again without turning the printing medium P over via a re-circulation convey mechanism (not shown). The second toner image is transferred to the side on which the first image has been printed. The printing medium P is introduced into the fixing device (image heating device) 100 again where the second toner image is fixed, and a multiple image print is output.

(2) Fixing Device (Image Heating Device) 100

Figure 3:
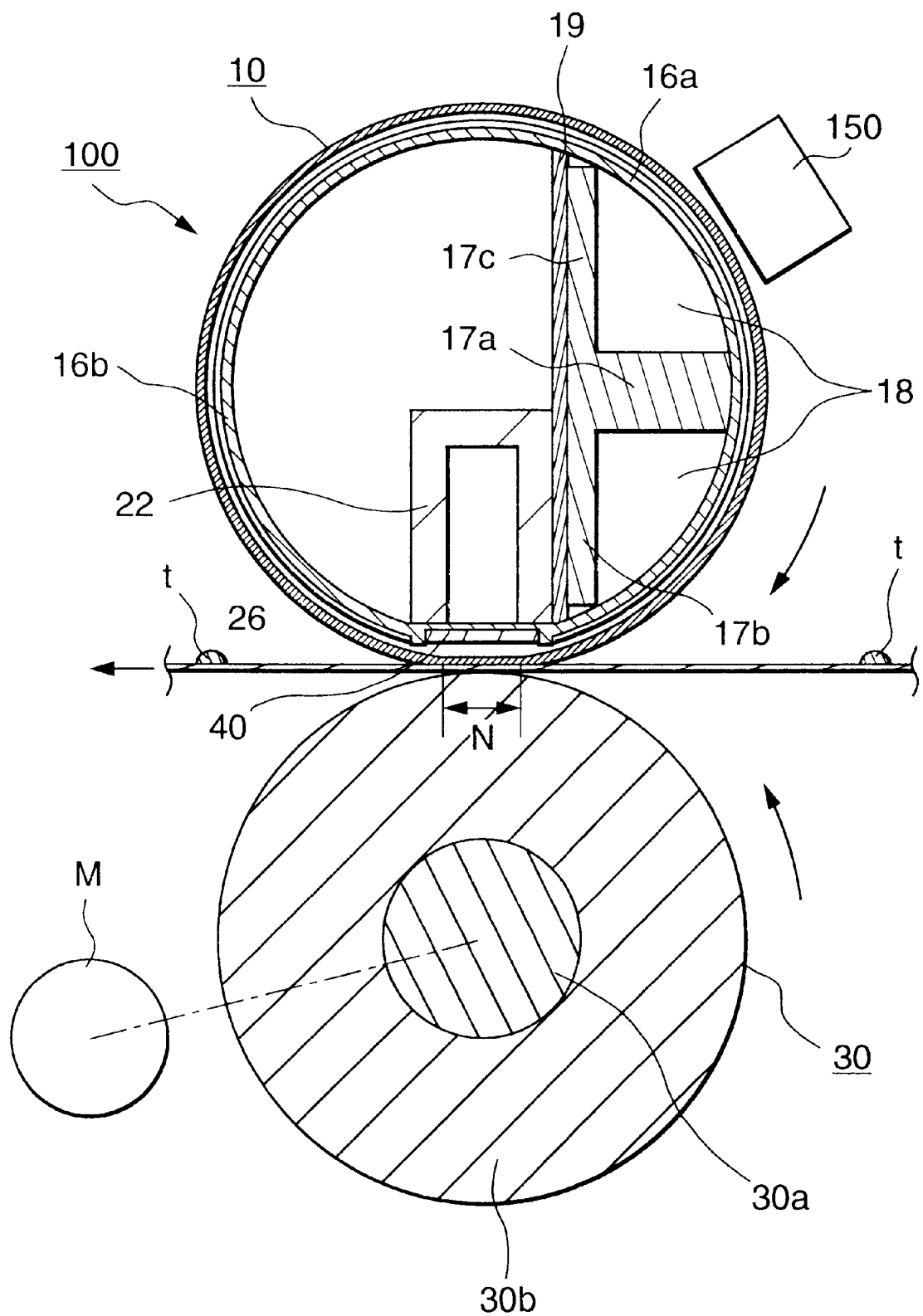
FIG. 3 is a cross-sectional side view showing the main part of a fixing device in the image forming apparatus shown in FIG. 2.
Figure 4:
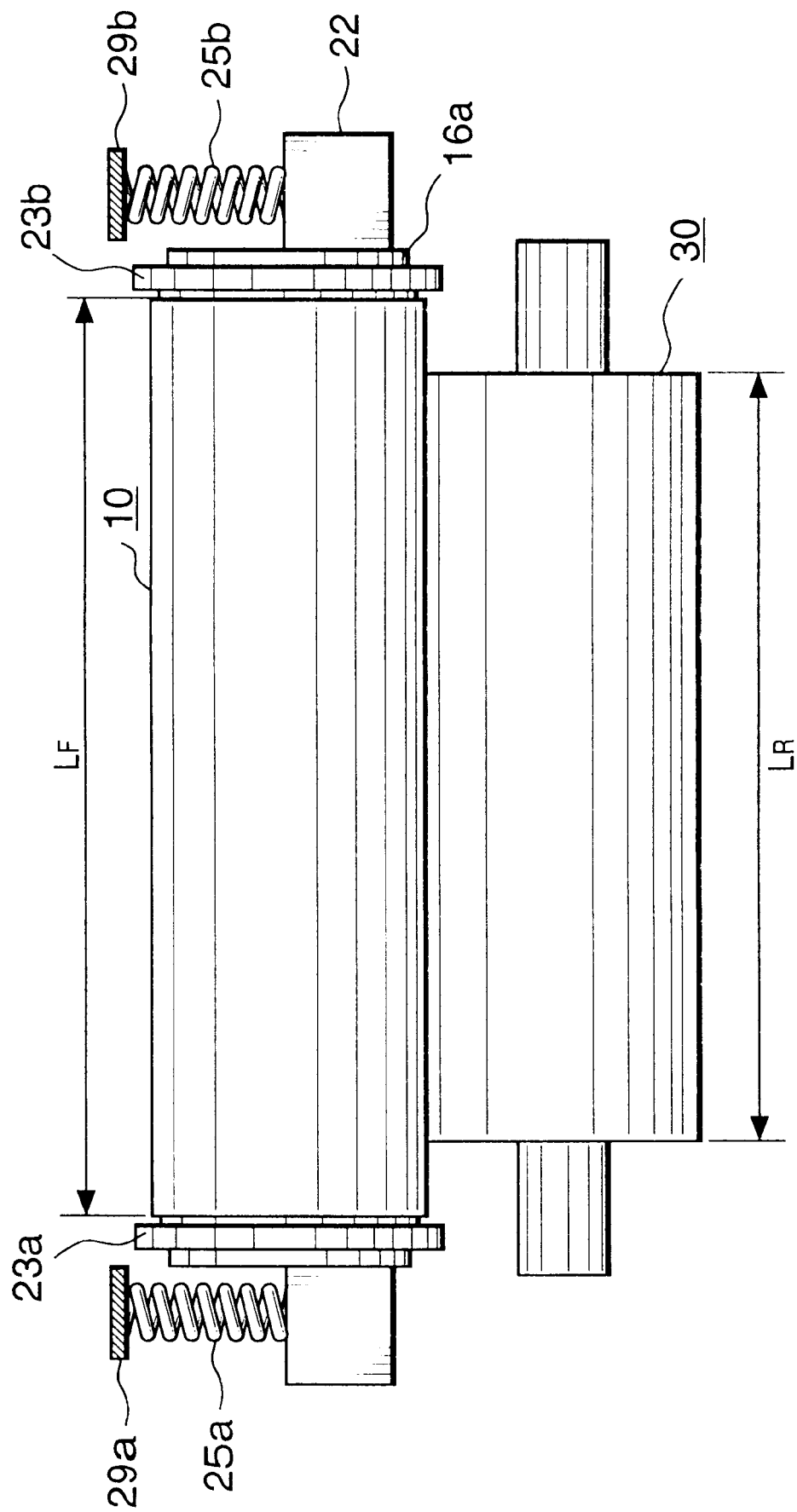
FIG. 4 is a plan view showing the main part of the fixing device in the image forming apparatus shown in FIG. 2.
Figure 5:
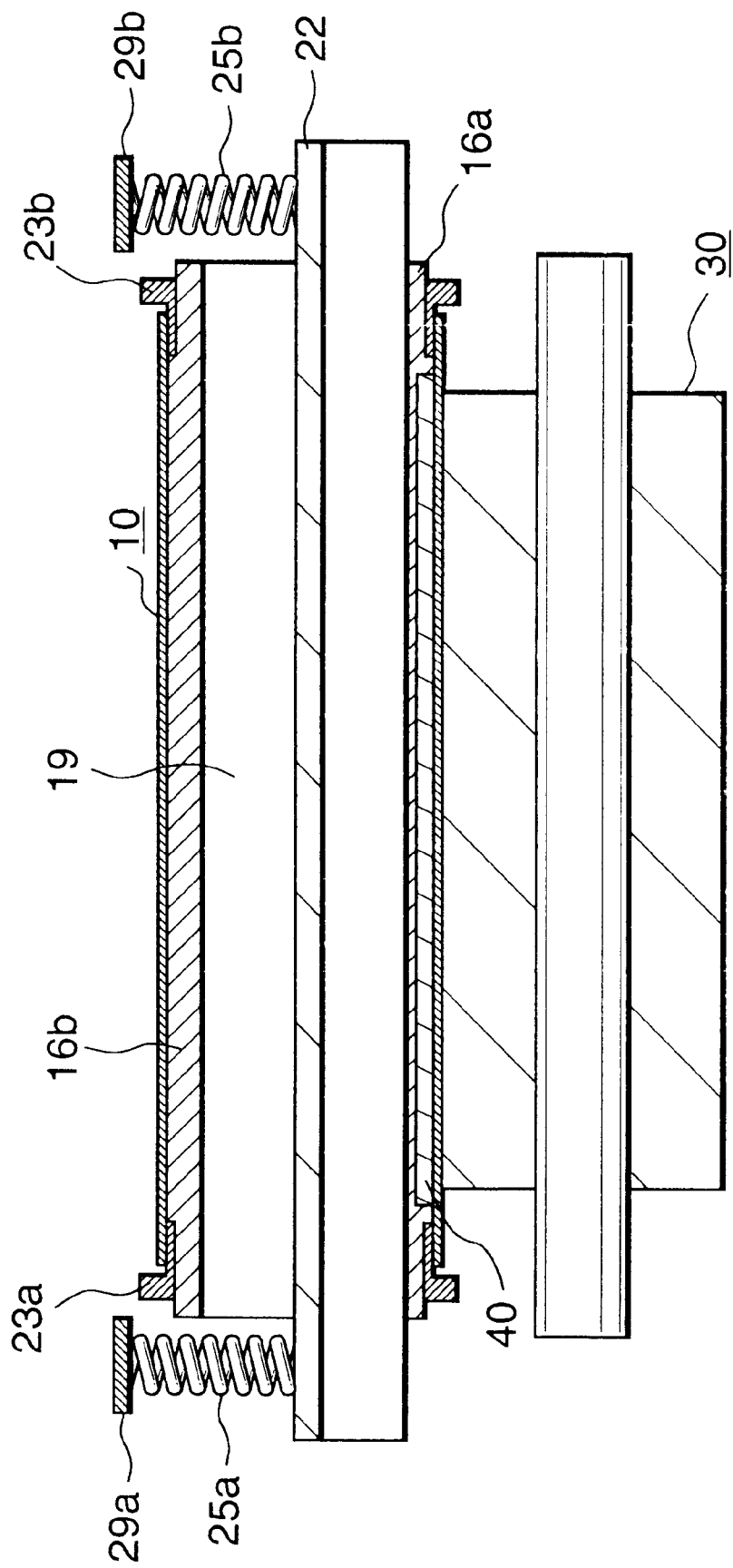
FIG. 5 is a longitudinal sectional view of FIG. 4.

The fixing device (image heating device) 100 of the image forming apparatus will be explained. The fixing device (image heating device) 100 of the first embodiment is of press roller driving type/electromagnetic induction heating type using a cylindrical electromagnetic induction heat generation belt. FIG. 3 is a cross-sectional view showing the main part of the fixing device in the image forming apparatus according to the first embodiment of the present invention, FIG. 4 is a plan view showing the main part of the fixing device, and FIG. 5 is a longitudinal sectional view showing the main part of the fixing device.

The arrangements of the respective portions of the fixing device (image heating device) 100 will be described in detail. A magnetic field generation means is made up of magnetic cores 17a, 17b, and 17c, and exciting coil 18. The magnetic cores 17a, 17b, and 17c are made of a high-permeability material, preferably a material such as ferrite or permalloy used in the core of a transformer, and more preferably ferrite which hardly exhibits a loss even at 100 kHz or more. In the exciting coil 18, feeding portions 18a and 18b are connected to an exciting circuit 27 (see FIG. 6). The exciting circuit 27 can generate a high frequency of 20 kHz to 500 kHz by a switching power supply. The exciting coil 18 generates an alternating flux by an alternating current (high-frequency current) supplied from the exciting circuit 27.

Reference numerals 16a and 16b are belt guide members whose cross section has an almost arcuated groove shape. The belt guide members 16a and 16b constitute an almost column with their opening sides facing each other. A fixing film 10 as a cylindrical electromagnetic induction heat generation belt is loosely fitted on the outer surface of the column. The belt guide member 16a incorporates the magnetic cores 17a, 17b, and 17c and exciting coil 18 serving as the magnetic field generation means. As shown in FIG. 5, a good heat conduction member 40 longitudinal in a direction perpendicular to the paper surface is disposed inside the fixing film 10 in opposition to a press roller 30 at a nip portion N. In the first embodiment, the good heat conduction member 40 is made of aluminum. The good heat conduction member 40 has a thermal conductivity of $k=240[W\_m^{-1}\_K^{-1}]$ and a thickness of 1 [mm].

The good heat conduction member 40 is disposed outside a magnetic field generated by the exciting coil 18 and magnetic cores 17a, 17b, and 17c serving as the magnetic field generation means so as to prevent the influence of the magnetic field on the good heat conduction member 40. More specifically, the good heat conduction member 40 is disposed at a position apart from the exciting coil 18 by the magnetic core 17c, and positioned outside the magnetic path of the exciting coil 18, thereby preventing any influence on the good heat conduction member 40.

Reference numeral 22 denotes a horizontally elongated pressurizing rigid stay in contact with the flat portion of the inner surface of the belt guide member 16b; 19, an insulating member for insulating between the magnetic cores 17a, 17b, and 17c and exciting coil 18, and the pressurizing rigid stay 22. Flange members 23a and 23b are fitted on the two, left and right ends of the assembly of the belt guide members 16a and 16b, and rotatably attached while the left and right positions are fixed. The flange members 23a and 23b receive the ends of the fixing film 10 in rotating it, and regulate offset movement in the longitudinal direction of the belt guide member of the fixing film 10.

A press roller 30 as a press member is constituted by a core metal 30a, and a heat-resistant elastic layer 30b which is concentrically formed like a roller around the core metal 30a, and made of silicone rubber, fluorine, or fluoroplastic. The two ends of the core metal 30a are rotatably held by bearings between metal plates (not shown) of the device on the chassis side. Compression springs 25a and 25b are compressed and arranged between the two ends of the pressurizing rigid stay 22, and spring bearing members 29a and 29b of the device on the chassis side to apply a press force to the pressurizing rigid stay 22. As a result, the lower surface of the belt guide member 16a and the upper surface of the press roller 30 urge against each other via the fixing belt 10, thereby forming the fixing nip portion N with a predetermined width.

The press roller 30 is rotated by a driving means M counterclockwise indicated by an arrow. A rotational force acts on the fixing belt 10 by the frictional force between the press roller 30 and the outer surface of the fixing belt 10 that is generated by rotation of the press roller 30. While the inner surface of the fixing belt 10 slides in tight contact with the lower surface of the good heat conduction member 40 at the fixing nip portion N, the fixing belt 10 rotates on the outer surfaces of the belt guide members 16a and 16b clockwise indicated by an arrow at a peripheral speed substantially corresponding to the rotational peripheral speed of the press roller 30.

In this case, a lubricant such as a heat-resistant grease is applied between the lower surface of the good heat conduction member 40 and the inner surface of the fixing belt 10 at the fixing nip portion N in order to reduce the sliding frictional force between the lower surface of the good heat conduction member 40 and the inner surface of the fixing belt 10 at the fixing nip portion N. Alternatively, the lower surface of the good heat conduction member 40 may be covered with a lubricating member. This can prevent a decrease in durability of the fixing belt 10 caused by scratching the sliding fixing belt 10 when the good heat conduction member 40 is made of a material such as aluminum whose surface smoothness is not good, or finishing is simplified.

The good heat conduction member 40 has an effect of unifying the temperature distribution in the longitudinal direction. For example, when small-size paper is passed, the heat quantity of a paper non-passing portion on the fixing belt 10 transfers to the good heat conduction member 40, and to the small-size paper passing portion by longitudinal thermal conduction of the good heat conduction member 40. Accordingly, the good heat conduction member 40 can attain an effect of reducing the power consumption in passing small-size paper.

Figure 6:
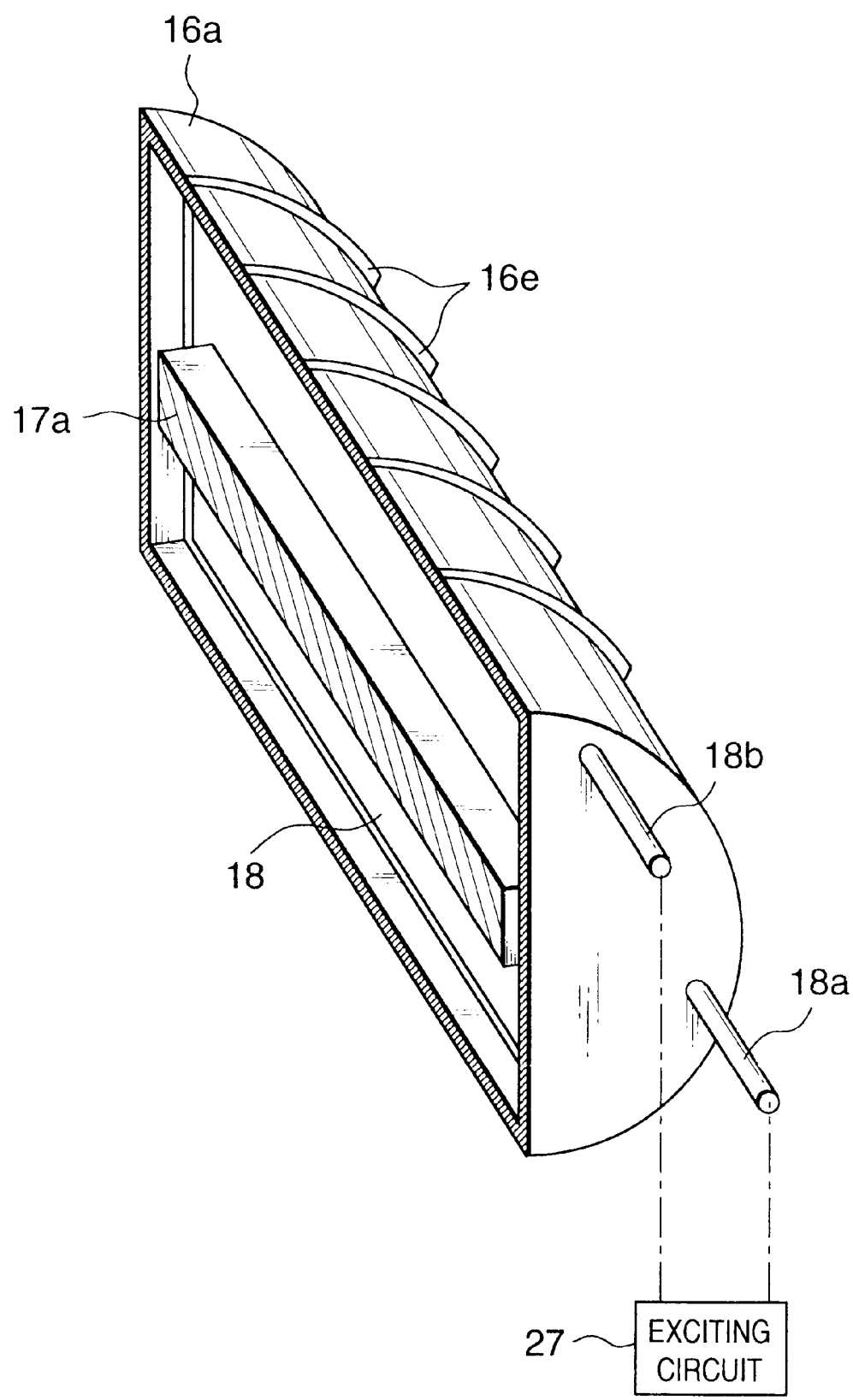
FIG. 6 is a perspective view showing the belt guide member, exciting coil, and the like of the fixing device in the image forming apparatus shown in FIG. 2.

As shown in FIG. 6, projecting ribs 16e are formed on the outer surface of the belt guide member 16a at a predetermined longitudinal interval. The projecting ribs 16e reduce the contact sliding resistance between the outer surface of the belt guide member 16a and the inner surface of the fixing belt 10 to reduce a rotational load on the fixing belt 10.

Figure 7:
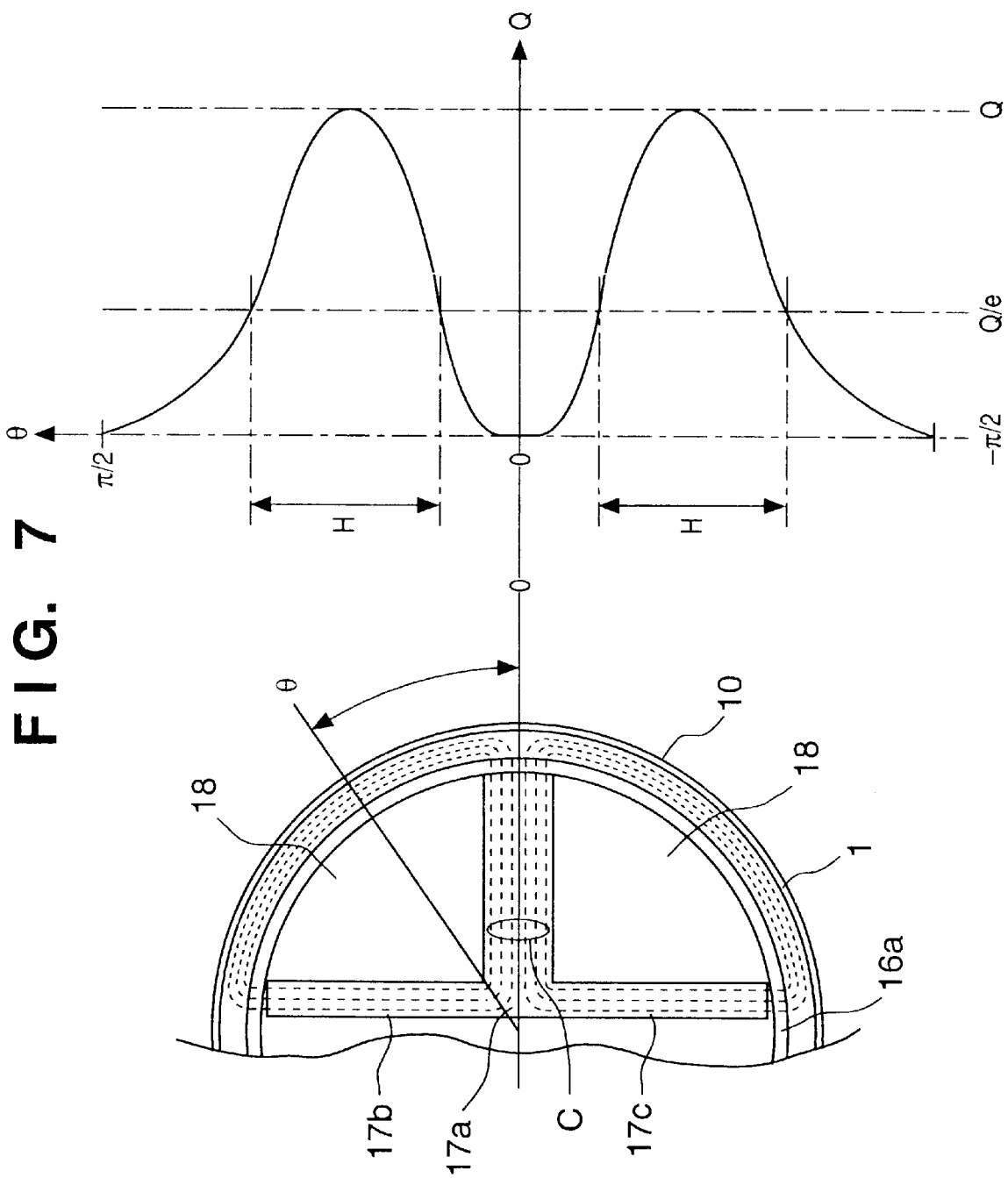
FIG. 7 is an explanatory view showing generation of an alternating flux on the fixing belt or the like of the fixing device in the image forming apparatus shown in 2.

FIG. 7 schematically shows generation of an alternating flux. A magnetic flux C represents part of a generated alternating flux. The alternating flux C guided by the magnetic cores 17a, 17b, and 17c generates an eddy current in an electromagnetic induction heat generation layer 1 of the fixing belt 10 between the magnetic cores 17a and 17b and between the magnetic cores 17a and 17c. This eddy current generates Joule heat (excessive current loss) in the electromagnetic induction heat generation layer 1 by the specific resistance of the electromagnetic induction heat generation layer 1.

A heat quantity Q is determined by the density of a magnetic flux passing through the electromagnetic induction heat generation layer 1, and exhibits a distribution as shown in the graph of FIG. 7. In the graph of FIG. 7, the ordinate represents a position in the circumferential direction on the fixing belt 10 that is given by an angle θ using the center of the magnetic core 17a as 0, and the abscissa represents the heat quantity Q in the electromagnetic induction heat generation layer 1 of the fixing belt 10. In this case, letting Q be the maximum heat quantity, a heat generation region H is defined as a region where the heat quantity is Q/e or more, which is a heat quantity necessary for fixing.

The temperature of the fixing nip portion N is maintained at a predetermined temperature by controlling current supply to the exciting coil 18 by a temperature system including a temperature detection means (not shown). Reference numeral 26 denotes a temperature sensor such as a thermistor for detecting the temperature of the fixing belt 10. In the first embodiment, the temperature of the fixing nip portion N is controlled based on temperature information of the fixing belt 10 measured by the temperature sensor 26.

The fixing belt 10 rotates, and power is supplied from the exciting circuit 27 to the exciting coil 18 to cause electromagnetic induction heat generation of the fixing belt 10, as described above. The temperature of the fixing nip portion N rises to a predetermined temperature and is adjusted. In this state, a printing medium P which is conveyed from an image formation means and has an unfixed toner image t is introduced between the fixing belt 10 and the press roller 30 at the fixing nip portion N with an image surface facing up, i.e., facing the fixing belt surface. The image surface comes into tight contact with the outer surface of the fixing belt 10 at the fixing nip portion N, and the printing medium P is clamped and conveyed together with the fixing belt 10 at the fixing nip portion N.

While the printing medium P is clamped and conveyed together with the fixing belt 10 at the fixing nip portion N, the printing medium P is heated by heat generated by electromagnetic induction of the fixing belt 10 to heat and fix the unfixed toner image t on the printing medium P. After the printing medium P passes through the fixing nip portion N, the printing medium P is separated from the outer surface of the rotating fixing belt 10, and discharged and conveyed. After passing through the fixing nip portion, the toner image heated and fixed to the printing medium P is cooled as a permanently fixed image.

In the first embodiment, as shown in FIG. 3, a thermoswitch 150 as a temperature detection element is arranged at a position facing the heat generation region H (see FIG. 7) of the fixing belt 10 in order to cut off power to the exciting coil 18 in a runaway.

Figure 8:
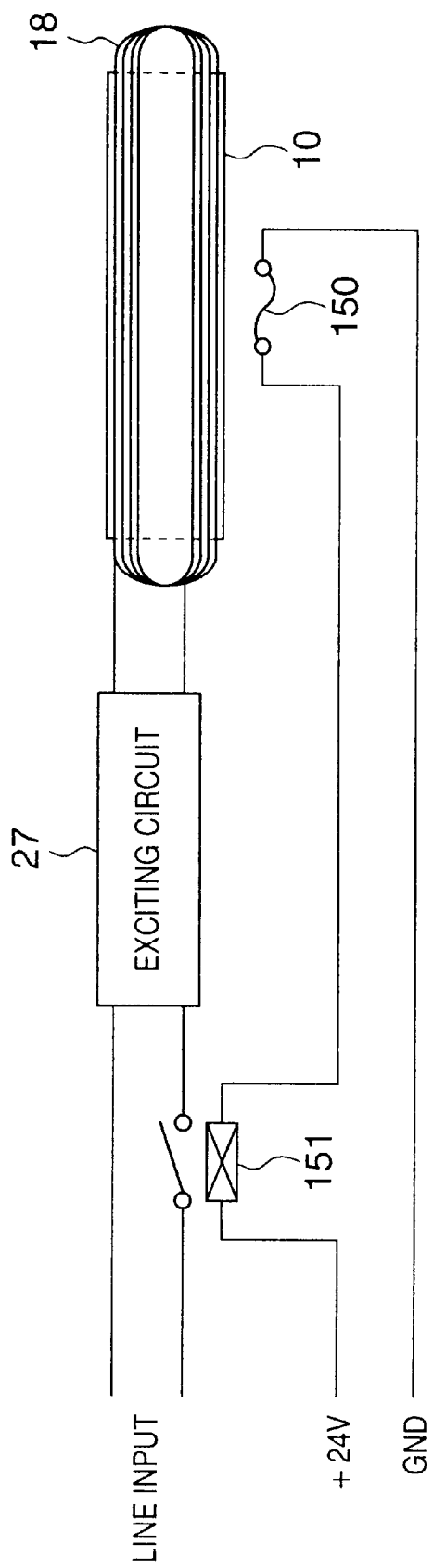
FIG. 8 is a circuit diagram showing an arrangement of a safety circuit in the image forming apparatus shown in FIG. 2.

FIG. 8 is a circuit diagram showing a safety circuit used in the first embodiment. The thermoswitch 150 serving as a temperature detection element is series-connected to a +24-V DC power supply and relay switch 151. When the thermoswitch 150 is turned off, power to the relay switch 151 is cut off, and the relay switch 151 operates to cut off power to the exciting circuit 27, thereby cutting off power to the exciting coil 18. The OFF operation temperature of the thermoswitch 150 is set to 220° C. The thermoswitch 150 is arranged in non-contact with the outer surface of the fixing belt 10 so as to face the heat generation region H of the fixing belt (film) 10. The distance between the thermoswitch 150 and the fixing belt 10 is set to about 2 mm. This can prevent a decrease in durability of a fixed image caused by scratching the fixing belt 10 by contact of the thermoswitch 150.

According to the first embodiment, even when the fixing device (fixing unit) stops while clamping paper at the fixing nip portion N, power is kept supplied to the exciting coil 18, and the fixing belt 10 keeps generating heat, no heat is generated at the fixing nip portion N where paper is clamped, and the paper is not directly heated, unlike an arrangement in which heat is generated at the fixing nip portion N as shown in FIG. 3 in a runaway of the fixing device caused by a device failure. Since the thermoswitch 150 is arranged in the heat generation region H where the heat quantity is large, the thermoswitch 150 detects 220° C., and is turned off. At this time, the relay switch 151 cuts off power to the exciting coil 18. The first embodiment can stop heat generation of the fixing belt 10 without igniting paper because the ignition temperature of paper is around 400° C.

Note that a temperature fuse can also be used as a temperature detection element instead of the thermoswitch. The first embodiment uses toner containing a low-softening-point material as the toner t, so the fixing device does not adopt any oil coating mechanism for preventing any offset. When toner not containing any low-softening-point material is used, the fixing device may adopt an oil coating mechanism. Also when toner containing a low-softening-point material is used, oil coating and cooling separation may be executed.

The exciting coil 18 and fixing belt 10 of the fixing device 100 will be explained in more detail.

(A) Exciting Coil 18

The exciting coil 18 is formed from a bundle (bundle wire) of a plurality of copper thin wires each insulated as a conductor (electric wire) forming a coil (loading coil). The bundle wire is wound a plurality of number of times to form the exciting coil. In this embodiment, the bundle wire is wound by 10 turns to form the exciting coil 18. The insulation covering is preferably a heat-resistant covering in consideration of thermal conduction by heat generation of the fixing belt 10. For example, a covering of amide-imide or polyimide is preferably used. The density of the exciting coil 18 may be increased by externally applying a pressure.

The exciting coil 18 is shaped along the curved surface of the heat generation layer, as shown in FIG. 3. In the first embodiment, the distance between the heat generation layer of the fixing belt 10 and the exciting coil 18 is set to about 2 mm. The material of the exciting coil holding member 19 is preferably excellent in insulation and thermal resistance. For example, the material is selected from a phenol resin, fluoroplastic, polyimide resin, polyamide resin, polyamide-imide resin, PEEK resin, PES resin, PPS resin, PFA resin, PTFE resin, FEP resin, and LCP resin.

The magnetic flux absorption efficiency is higher as the distance between the magnetic cores 17a, 17b, and 17c and exciting coil 18, and the heat generation layer of the fixing belt 10 is shorter. If this distance exceeds 5 mm, the efficiency greatly decreases. Hence, the distance preferably falls within 5 mm. As far as the distance falls within 5 mm, the distance between the heat generation layer of the fixing belt 10 and the exciting coil 18 need not be constant. As for the wires, i.e., feeding portions 18a and 18b (FIG. 6) extracted from the exciting coil holding member 19 of the exciting coil 18, the bundle wires outside the exciting coil holding member 19 are insulated.

(B) Fixing Belt (Fixing Film) 10

Figure 9:
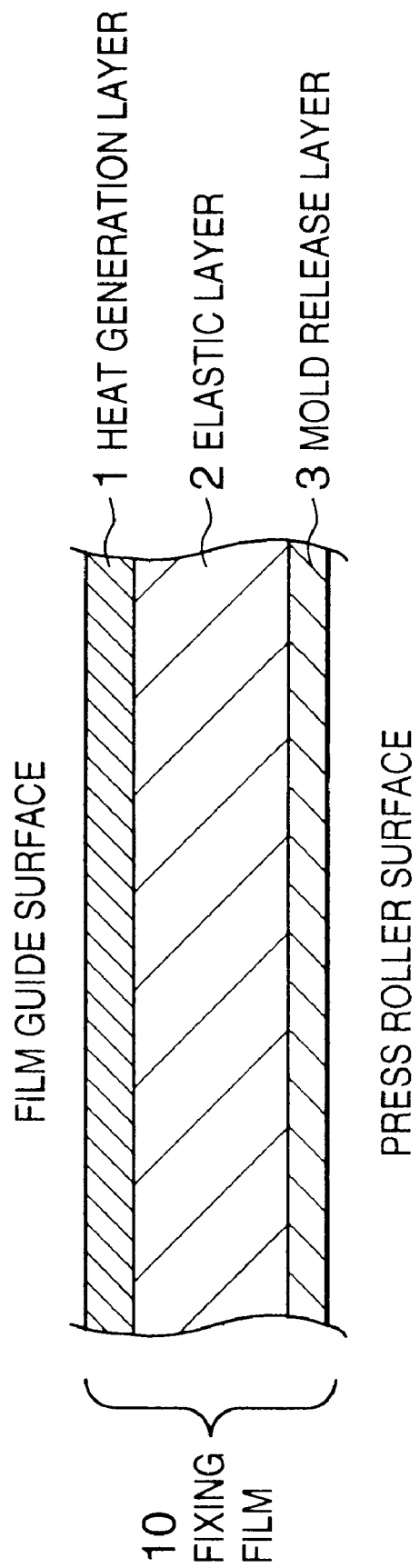
FIG. 9 is a longitudinal sectional view showing a layered structure of the fixing belt (fixing film) in the image forming apparatus shown in FIG. 2.

FIG. 9 is a view showing the layered structure of the fixing belt (fixing film) 10 in the first embodiment. The fixing belt (fixing film) 10 of this embodiment has a composite structure of the heat generation layer 1 formed from a metal belt or the like serving as the base of the electromagnetic induction heat generation fixing belt 10, an elastic layer 2 stacked on the outer surface of the heat generation layer 1, and a mold release layer 3 stacked on the outer surface of the elastic layer 2. Primer layers (not shown) may be formed between these layers in order to bond the heat generation layer 1 and elastic layer 2, and the elastic layer 2 and mold release layer 3. In the almost cylindrical fixing belt 10, the heat generation layer 1 serves as an inner surface side, and the mold release layer 3 serves as an outer surface side. As described above, an alternating flux acts on the heat generation layer 1 to generate an eddy current in the heat generation layer 1, and the heat generation layer 1 generates heat. This heat heats the fixing belt 10 via the elastic layer 2 and mold release layer 3. The fixing belt 10 heats the printing medium P serving as a member to be heated that passes through the fixing nip portion N, thereby heating and fixing a toner image.

(a) Heat Generation Layer 1

The heat generation layer 1 is preferably made of a ferromagnetic metal such as nickel, iron, ferromagnetic SUS, or nickel-cobalt alloy. The heat generation layer 1 may be made of a nonmagnetic metal, but is more preferably made of a metal such as nickel, iron, magnetic stainless steel, or nickel-cobalt alloy which highly absorbs a magnetic flux. The thickness of the heat generation layer 1 is preferably 200 µm or less which is larger than a skin depth given by the following equation. A skin depth σ[m] is given by a frequency f [Hz], permeability $\mu$, and specific resistance $\rho[\Omega m]$ of the exciting circuit 27:

$$\sigma = 503 \times (\rho/f\mu)^{1/2}$$

Figure 10:
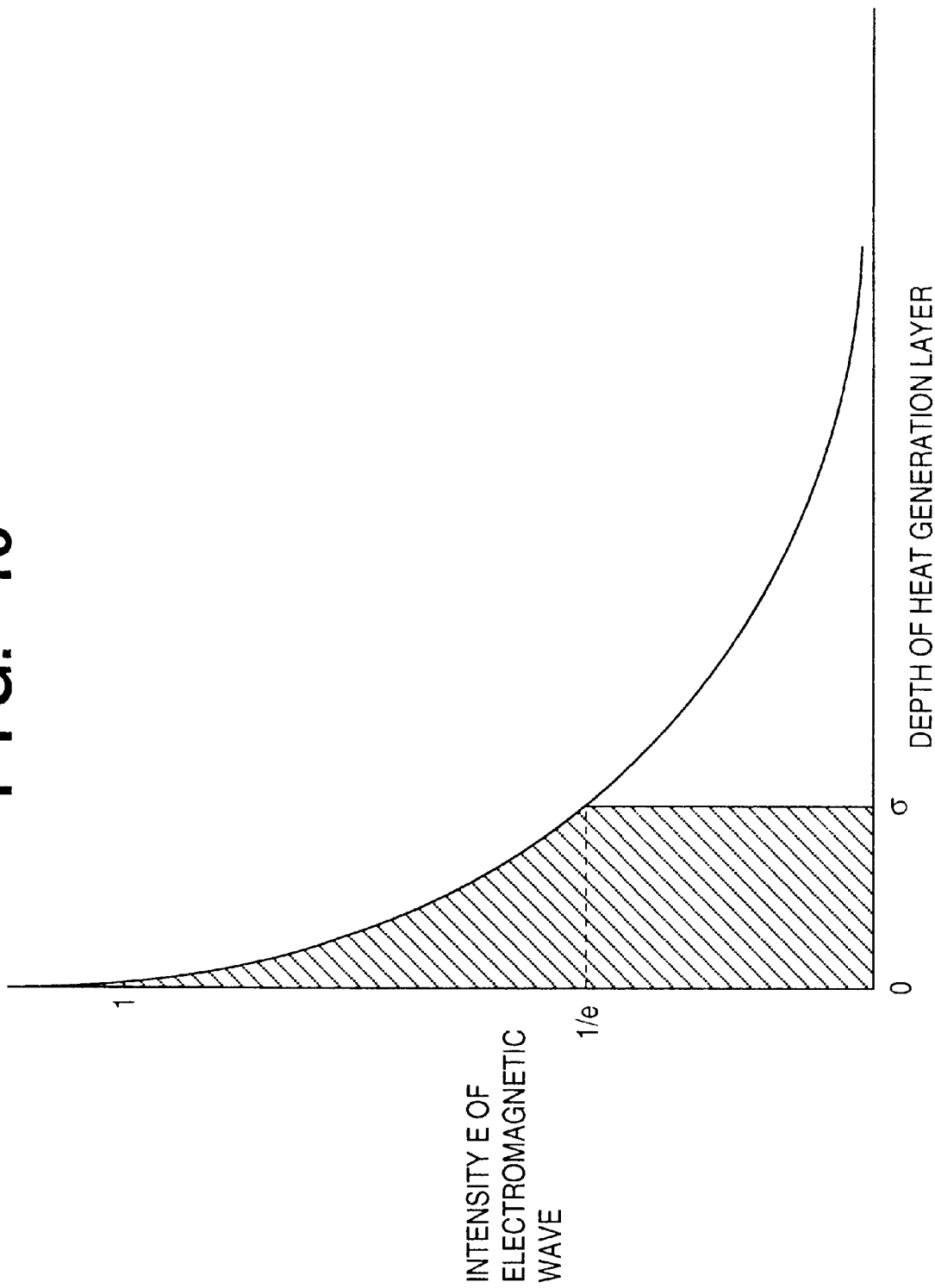
FIG. 10 is a graph showing the relationship between the intensity of an electromagnetic wave and the depth of a heat generation layer.

This represents the depth of absorption of an electromagnetic wave used in electromagnetic induction. At a larger depth, the intensity of the electromagnetic wave is 1/e or less. In other words, almost all the energy is absorbed up to this depth (see FIG. 10). FIG. 10 is a graph showing the relationship between the intensity of the electromagnetic wave and the depth of the heat generation layer. The thickness of the heat generation layer 1 is preferably 1 to 100 µm. If the thickness of the heat generation layer 1 is smaller than 1 µm, almost all the electromagnetic energy is not absorbed, resulting in low efficiency. If the thickness of the heat generation layer 1 exceeds 100 µm, the rigidity is excessively high, the flexibility is low, and it is not practical to use the fixing belt 10 as a rotary member. Therefore, the thickness of the heat generation layer 1 is preferably 1 to 100 µm.

(b) Elastic Layer 2

The elastic layer 2 is made of a silicone rubber, fluororubber, or fluorosilicone rubber which is excellent in thermal resistance and thermal conductivity. The depth of the elastic layer 2 is preferably 10 to 500 µm. The elastic layer 2 is thick enough to ensure the quality of a fixed image. In printing a color image, a solid image is formed over a large area on the printing medium P particularly for a photographic image. In this case, if the heating surface (mold release layer 3) cannot follow the three-dimensional structure of a printing medium or toner layer, heating nonuniformity occurs, and gloss nonuniformity occurs in the image between a portion where the heat transfer amount is large and a portion where the heat transfer amount is small.

The glossiness is high at the portion where the heat transfer amount is large, and low at the portion where the heat transfer amount is small. When the thickness of the elastic layer 2 is 10 µm or less, the heating surface cannot follow the three-dimensional structure of a printing medium or toner layer, causing image gloss nonuniformity. When the thickness of the elastic layer 2 is 1,000 µm or more, the thermal resistance of the elastic layer 2 is high, and quick start is difficult to realize. The thickness of the elastic layer 2 is more preferably 50 to 500 µm.

If the hardness of the elastic layer 2 is too high, the heating surface cannot follow the three-dimensional structure of a printing medium or toner layer, and image gloss nonuniformity occurs. To prevent this, the hardness of the elastic layer 2 is 60° (JIS-A) or less, and more preferably 45° (JIS-A) or less. A thermal conductivity λ of the elastic layer 2 is $$6 \times 10^{-4} \leq \lambda \leq 2 \times 10^{-3} [\text{cal/cm\_sec\_deg.}]$$

When the thermal conductivity λ is $$\lambda < 6 \times 10^{-4} [\text{cal/cm\_sec\_deg.}]$$

the thermal resistance is high, and the temperature rise on the surface layer (mold release layer 3) of the fixing belt 10 is slow.

When the thermal conductivity λ is $$\lambda > 2 \times 10^{-3} [\text{cal/cm\_sec\_deg.}]$$

the elastic layer 2 becomes too hard, or permanent compression set degrades.

Accordingly, the thermal conductivity λ is preferably $$6 \times 10^{-4} \leq \lambda \leq 2 \times 10^{-3} [\text{cal/cm\_sec\_deg.}]$$

and more preferably $$8 \times 10^{-4} \leq \lambda \leq 1.5 \times 10^{-3} [\text{cal/cm\_sec\_deg.}]$$

(c) Mold release layer 3

The mold release layer 3 can be selected from a fluoroplastic, silicone resin, fluorosilicone rubber, fluororubber, silicone rubber, PFA, PTFE, and FEP which are excellent in release properties and thermal resistance. The thickness of the mold release layer 3 is preferably 1 to 100 µm. If the thickness of the mold release layer 3 is smaller than 1 µm, a portion poor in mold release properties is formed due to coating nonuniformity of a coating film, or the durability is insufficient. If the thickness of the mold release layer 3 exceeds 100 μm, heat conduction degrades. Especially for a resin-based mold release layer, the hardness becomes excessively high, which impairs the effects of the elastic layer 2.

Figure 11:
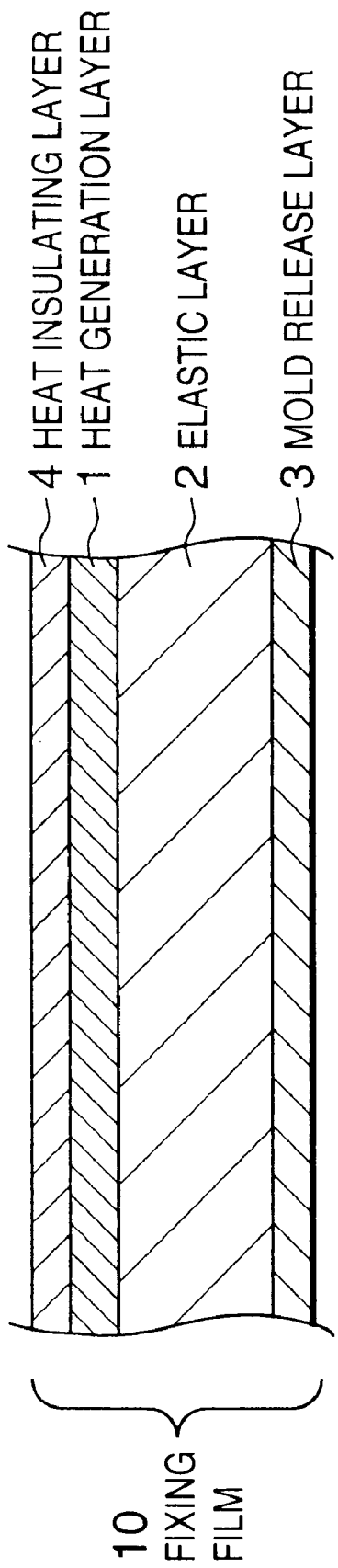
FIG. 11 is a longitudinal sectional view showing another layered structure of the fixing belt (fixing film) in the image forming apparatus shown in FIG. 2.

Alternatively, as shown in FIG. 11, a heat insulating layer 4 may be formed on the belt guide surface (surface opposite to the elastic layer 2 of the heat generation layer 1) of the heat generation layer 1 in the structure of the fixing belt (fixing film) 10. The heat insulating layer 4 is preferably made of a heat insulating resin such as a fluoroplastic, polyimide resin, polyamide resin, polyamide-imide resin, PEEK resin, PES resin, PPS resin, PFA resin, PTFE resin, or FEP resin.

The thickness of the heat insulating layer 4 is preferably 10 to 1,000 μm. When the thickness of the heat insulating layer 4 is smaller than 10 μm, no heat insulating effect can be obtained, and the durability is insufficient. When the thickness of the heat insulating layer 4 exceeds 1000 μm, the distance from the magnetic cores 17a, 17b, and 17c and exciting coil 18 to the heat generation layer 1 becomes to large, and the magnetic flux cannot be satisfactorily absorbed by the heat generation layer 1. The heat insulating layer 4 can insulate heat so as to prevent heat generated in the heat generation layer 1 from transferring to the inner side of the fixing belt 10. The heat supply efficiency to the printing medium P is higher than in a case wherein no heat insulating layer 4 is formed. Accordingly, the power consumption can be suppressed.

Figure 12:
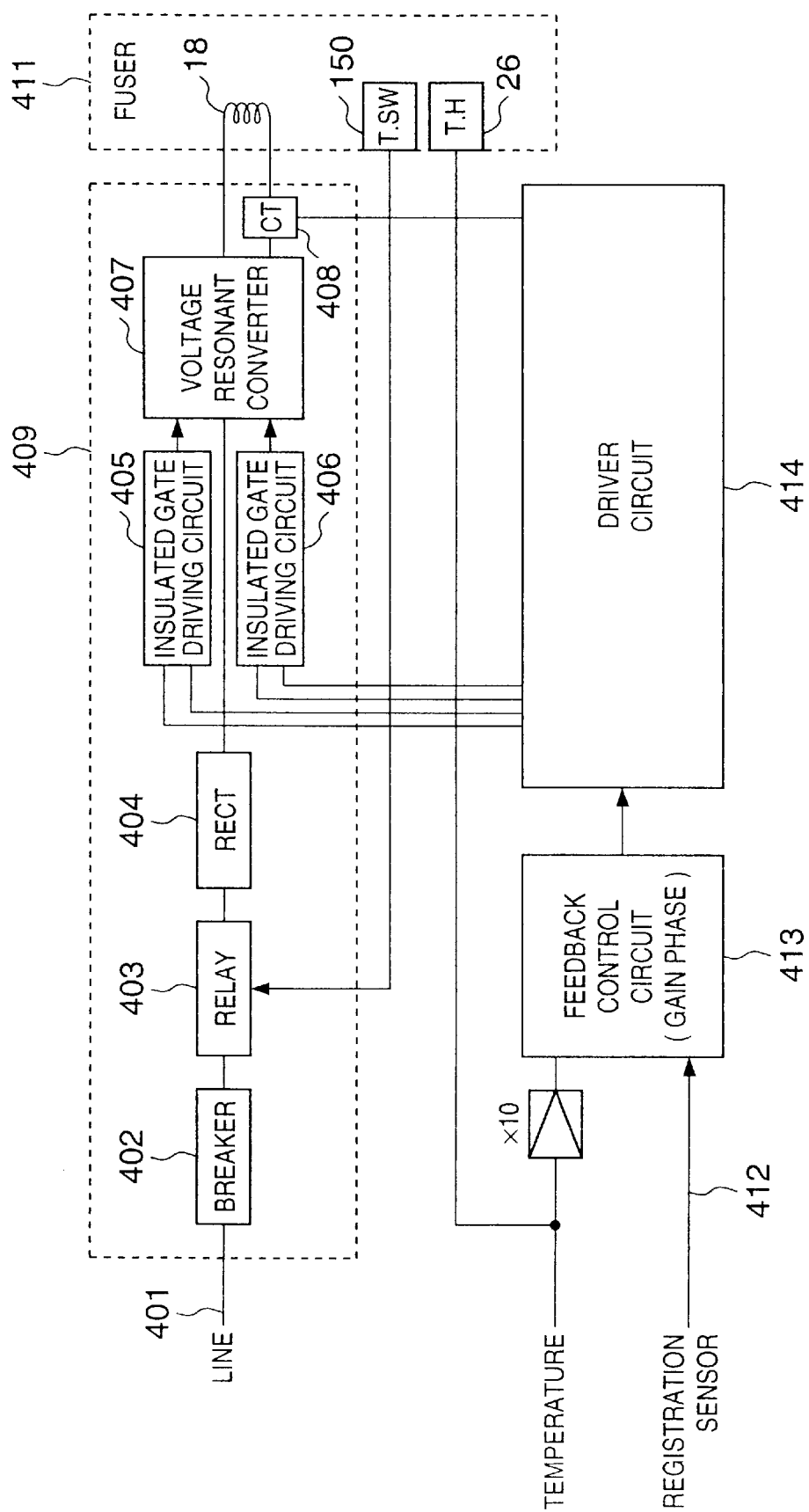
FIG. 12 is a block diagram showing the whole arrangement of an induction heating control unit including a voltage resonant type converter in the image forming apparatus according to the first and second embodiments of the present invention.
Figure 13A:
FIGS. 13A to 13I are waveform charts showing operation waveforms in the voltage resonant type converter in the image forming apparatus according to the first embodiment of the present invention.
Figure 13B:
Figure 13C:
Figure 13D:
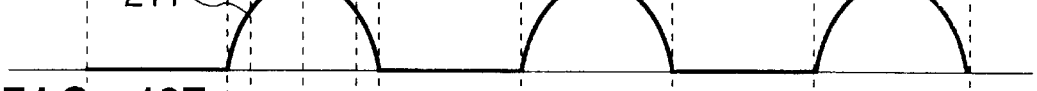
Figure 13E:
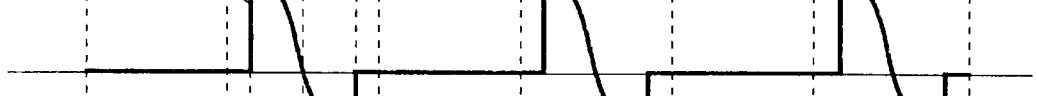
Figure 13F:
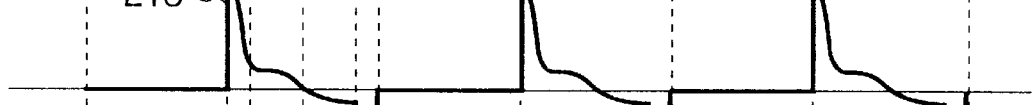
Figure 13G:
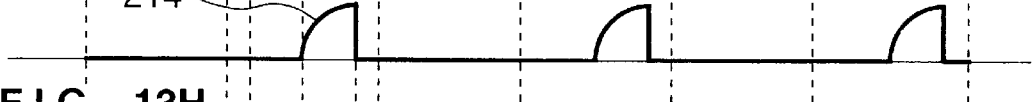
Figure 13H:
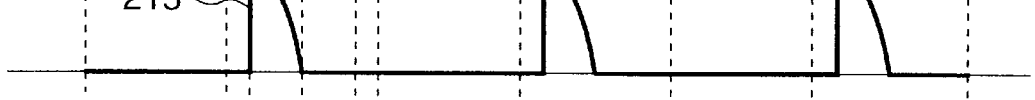
Figure 13I:
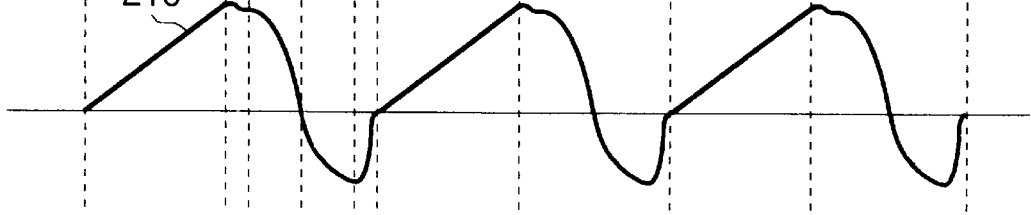
Figure 15A:
FIGS. 15A to 15I are waveform charts showing operation waveforms at respective portions when power is narrowed down in the voltage resonant type converter in the image forming apparatus according to the first embodiment of the present invention.
Figure 15B:
Figure 15C:
Figure 15D:
Figure 15E:
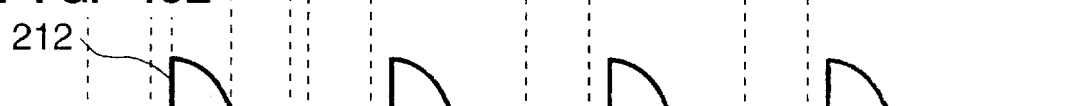
Figure 15F:
Figure 15G:
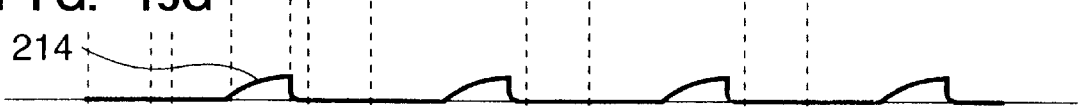
Figure 15H:
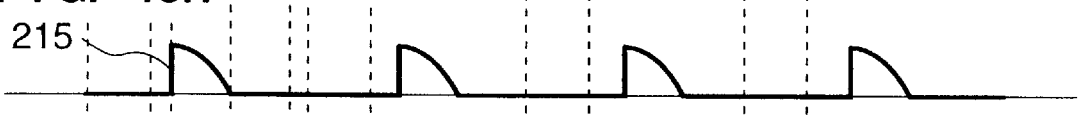
Figure 15I:
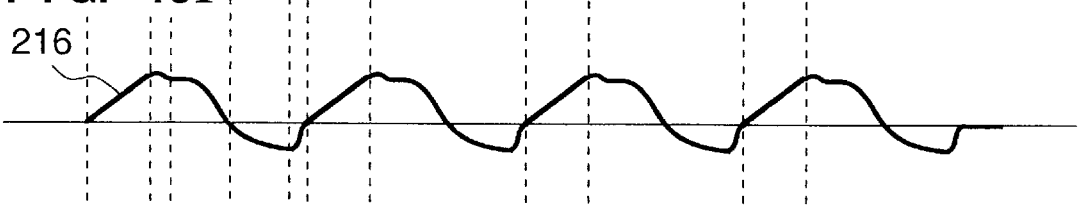

FIG. 12 is a block diagram showing the whole arrangement of an induction heating control unit including an output converter (to be described later) shown in FIG. 1 in the image forming apparatus according to the first embodiment of the present invention. The induction heat control unit of the image forming apparatus comprises a voltage control circuit 409, fixing unit (Fuser) 411, feedback control circuit 413, and driver circuit 414. The voltage control circuit 409 comprises an eddy current breaker 402, relay 403, rectifying circuit (RECT) 404, insulated gate driving circuits 405 and 406, voltage resonant converter 407, and current transformer 408. In FIG. 12, reference numeral 401 denotes a power supply line input terminal; and 412, a heating ON/OFF signal for the fixing unit.

The arrangement of the main part will be described in detail together with the operation. The eddy current breaker 402 protects an eddy current. The rectifying circuit 404 is made up of a bridge rectifying circuit for performing full-wave rectification from an AC input, and a capacitor serving as a high-frequency filter. The voltage resonant converter 407 switches the current. The current transformer 408 detects a switching current switched by the voltage resonant converter 407, and is connected to the exciting coil 18 of the fixing unit (fixing device).

The fixing unit 411 has as electrical components the exciting coil 18, the temperature detection thermistor (temperature sensor) 26, and a thermoswitch 150 for detecting excessive temperature rise. The heating ON/OFF signal 412 for the fixing unit is sent from the sequence controller of the image forming apparatus (printer) (not shown). The feedback control circuit 413 controls the controlled variable in comparison with a target temperature on the basis of the thermistor temperature detection value of the fixing unit. The driver circuit 414 receives a feedback control signal from the feedback control circuit 413, and executes control suitable for the control form of the converter.

When AC power is applied to the rectifying circuit 404 via the eddy current breaker 402 and relay 403 upon reception of AC input power from the power supply line input terminal 401, the full-wave rectifying diode of the rectifying circuit 404 generates ripple DC power. Then, the insulated gate driving circuits 405 and 406 are driven to alternately switch the switching element by the voltage resonant converter 407, thereby applying a high-frequency voltage to the exciting coil 18. A current flowing through the exciting coil 18 is controlled to vary an eddy current flowing through the fixing belt (fixing film) 10, thereby controlling heat generation power.

The operation is further explained with reference to FIG. 12. Upon reception of AC power from the power supply input terminal 401, the AC power enters the rectifying circuit 404 via the contact between the eddy current breaker 402 for protecting an eddy current and the relay 403. The exciting winding of the relay 403 detects the belt (film) temperature of the fixing unit, and is excited via the contact of the thermoswitch 150 which is turned off when the belt (film) temperature exceeds a prescribed temperature and abnormally rises. Assuming that trouble arises, and the temperature of the fixing unit abnormally rises, the relay 403 is cut off to turn off the power supply of the exciting circuit, thereby assuring the safety of the fixing unit from a thermal runaway. The rectifying circuit 404 generates a DC ripple wave from AC power by a rectifying bridge circuit (not shown), and supplies the DC ripple wave as power to the voltage resonant converter 407 via an LC filter. The operation of the voltage resonant converter 407 will be explained with reference to FIG. 1 (to be described later).

The current transformer (current detection transformer) 408, and insulated gate driving circuits 405 and 406 ensure double insulation of a live voltage circuit and secondary voltage circuit by insulation processing of the transformer. The fixing temperature is detected by the temperature sensor (thermistor) 26. A control signal given an optimal control coefficient which changes depending on the paper passing state of the fixing unit, the paper quality, and the fixing temperature executes gate control of a semiconductor switching element with an ON width control signal corresponding to voltage resonant control of the power supply by the driver circuit 414.

The voltage resonant type converter controls an excess/shortage from a target temperature by the switching-on width. The arrangement and operation will be explained in detail with reference to FIGS. 1 and 13A to 13I.

Figure 1:
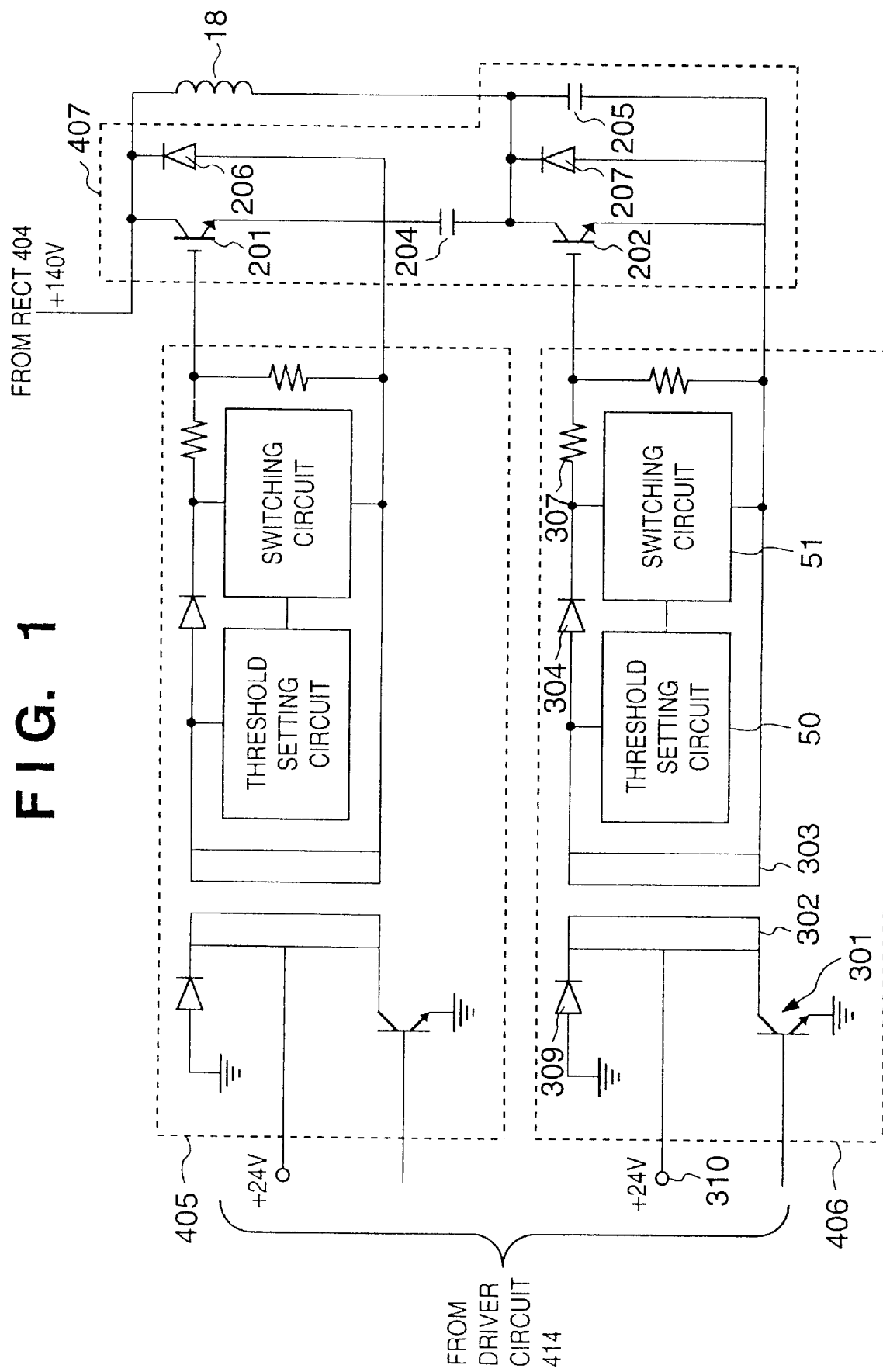
FIG. 1 is a circuit diagram showing an arrangement of a power supply device according to the first embodiment of the present invention.

FIG. 1 is a circuit diagram showing an arrangement of a voltage resonant type power supply device according to the first embodiment of the present invention. The power supply device according to the first embodiment of the present invention is constituted by the voltage resonant converter 407 having a switching IGBT 201 (first switching means), main switching IGBT 202 (second switching means), first resonant capacitor 204 (first electricity accumulation means), second resonant capacitor 205 (second electricity accumulation means), regenerative diode 206 (first rectifying means), and regenerative diode 207 (second rectifying means), and the two gate driving circuits 405 and 406 (to be described later) for respectively driving the two IGBTs 201 and 202.

The voltage resonant converter 407 will be described. The switching IGBT 201 connected to a power supply is series-connected to the first resonant capacitor 204, and the first resonant capacitor 204 is series-connected to the main switching IGBT 202. The exciting coil 18 for magnetic induction heating is connected between the power supply and the node between the first resonant capacitor 204 and the main switching IGBT 202, and the main switching IGBT 202 is parallel-connected to the second resonant capacitor 205. The switching IGBT 201 and main switching IGBT 202 are respectively parallel-connected to the regenerative diodes (rectifying elements) 206 and 207.

FIGS. 13A to 13I are waveform charts showing operation waveforms in the circuit arrangement of FIG. 1. Reference numeral 208 denotes a gate voltage waveform of the switching IGBT 201; 209, a gate voltage waveform of the main switching IGBT 202; 210, a current waveform of the main switching IGBT 202; 211, a voltage waveform of the main switching IGBT 202; 212, a current waveform of the first resonant capacitor 204; 213, a current waveform of the second resonant capacitor 205; 214, a current waveform of the switching IGBT 201; 215, a current waveform of the regenerative diode 206; and 216, an exciting current waveform of the exciting coil 18.

The operation of this circuit will be described in detail. By turning on the main switching IGBT 202, the induction current waveform 210 flows from the power supply (RECT 304) to the exciting coil 18. At the same time as switching-off operation (point A), the exciting coil 18 generates the flyback voltage 211 in a direction in which the current is maintained.

In the method according to the first embodiment of the present invention, the first resonant capacitor 204 and second resonant capacitor 205 have a difference in residual charges (influence of residual charges of the first resonant capacitor 204; to be described later). For this reason, immediately after OFF operation of the main switching IGBT 202, the flyback voltage 211 draws an arc defined by a resonant cycle $\omega=\sqrt{(L\times C)}$ determined by the second resonant capacitor 205 and exciting coil 18. Assume that the second resonant capacitor 205 is set to a capacitance of about 1/10 the first resonant capacitor 204. Hence, the voltage immediately after OFF operation generates a flyback voltage in a high cycle (period between point A and point B).

Vibrations of the flyback voltage turn on the regenerative diode 206 when the flyback voltage rises to the initial charging voltage of the first resonant capacitor 204 (point B). The flyback voltage 211 switches to a gentle sine wave and rises with the synthesized capacitance of the first resonant capacitor 204 and second resonant capacitor 205. Reference numeral 212 denotes the current waveform of the first resonant capacitor 204 at this time; 215, the current waveform of the regenerative diode 206; and 213, the current waveform of the second resonant capacitor 205.

When the voltage rises over time, and ω/4 passes, the voltage reaches the maximum point (point C). On the other hand, the current waveform 212 becomes a zero-crossing waveform having a minimum current value at the maximum voltage point (point C) as a result of flowing a cosine wave corresponding to the differential waveform of the voltage waveform. Since the regenerative diode 206 is turned off after the zero-crossing point, the gate of the switching IGBT 201 is turned on to regenerate a current (period between point C and point D). Reference numeral 214 denotes the current waveform of the switching IGBT 201 at this time. When the switching IGBT 201 is turned off (point D), the first resonant capacitor 204 is isolated, the second resonant capacitor 205 smaller in capacitance resonates, and the current waveform 214 draws a high-cycle arc (period between point D and point E). The period between point D and point E which is a characteristic feature of the first embodiment will be explained in more detail.

The second resonant capacitor 205 is loaded by all the discharge current flowing through the first resonant capacitor 204 at point D. This state is verified as a value contributing to vibrations of the circuit, i.e., changes in damping =$\sqrt{(L/C)}$ to find that C decreases, and the damping factor increases in proportion to the decrease in C, thereby obtaining vibrations having a strong short cycle. This high vibration voltage is the most important factor in voltage resonance, and generates a zero-crossing point in the flyback voltage waveform by voltage vibrations, i.e., point E in the voltage waveform 211.

At point E, both the current and voltage are low, and the switching loss can be minimized in switching the switching element. Also, the switching IGBT 201 which has switched the regenerated current performs switching operation at a small current value (point D) in which the voltage is relatively low around the power supply voltage and damped by an exciting load. From this, the switching IGBT 201 and main switching IGBT 202 can execute switching with a very small loss. In this arrangement, the switching IGBT 201 connected to the first resonant capacitor 204 can be activated from an OFF state even in activating the inverter. This can greatly reduce a transient burden generated in activating the resonant power supply.

Figure 16:
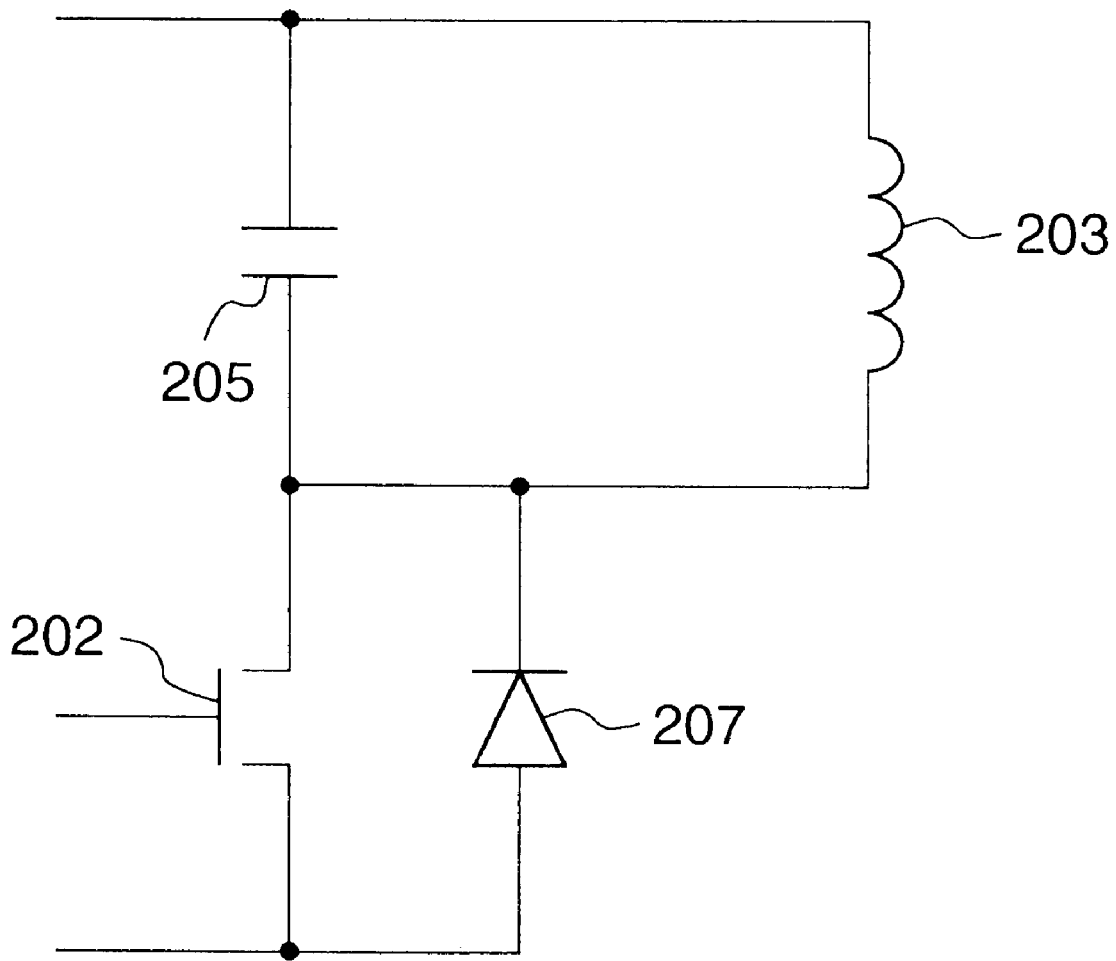
FIG. 16 is a circuit diagram showing a voltage resonance type inverter circuit according to a prior art.

FIGS. 14A to 14C show operation waveforms in the conventional voltage resonant converter shown in FIG. 16. FIGS. 15A to 15I show waveforms at respective portions when power is reduced in the synchronous charging voltage resonant type converter in the first embodiment of the present invention.

In the conventional voltage resonant type converter of FIGS. 14A to 14C, resonance starts with a constant determined by a resonant capacitor and exciting coil immediately after gate control is stopped. FIG. 14B shows a response waveform 211. As is apparent from the circuit arrangement, voltage vibrations are oscillatory waveform responses centered on a power supply voltage Vcc (broken line in FIG. 14B). Since the output is narrowed down, the current waveform exhibits a small maximum current of a triangular wave, as represented by the waveform 211, and thus power accumulated in the resonant circuit is small. For this reason, voltage vibrations do not sufficiently decrease from the power supply voltage Vcc, and the voltage (Vf) of the waveform 211 remains. This residual voltage is reduced to a voltage with a very low impedance by the resonant capacitor. If a switching element is turned on in this state, an excessive current flows through the switching element to damage it. This state is represented by a current waveform 210 of the switching element in FIG. 14C.

On the other hand, even when power is similarly narrowed down, waveforms at respective portions upon narrowing down power in the synchronous charging voltage resonant type converter in the first embodiment of the present invention can attain zero-crossing points of the voltage with satisfactory voltage vibration amplitudes by high damping operation caused by switching operation of the small-capacitance second resonant capacitor 205 for a period between points D and E. Minimization conditions are established for both the voltage and current at the ON timing (point E) of the main switching IGBT 202. Therefore, no excessive current by switching is generated, and small-loss switching can be realized.

The switching element described above, which flows a very large switching current, is a power switching element using an IGBT (Insulated Gate Bipolar Transistor) that is recently becoming popular in electromagnetic cookers and the like and will widen its product field in the future. The IGBT can realize a large current at lower cost than an FET.

Although the IGBT meets a demand for switching a large current, the switching speed is lower than a high-speed switching element such as an FET because the switching portion has an NPN junction transistor structure. Hence, how to efficiently operate the IGBT determines the product cost.

The IGBT simply has the switching terminals of the collector and emitter of a transistor, and the control terminal of a MOS gate structure to be controlled. A control signal performs field operation by applying a voltage to the gate terminal. The gate has a relatively large electrostatic capacitance between the gate and the emitter, and this electrostatic capacitance inhibits high-speed switching. Thus, how to charge/discharge the gate capacitance and appropriately apply a gate voltage waveform at a high speed is important.

The gate driving circuits (405 and 406) in the power supply device shown in FIG. 1 will be explained. Note that the gate driving circuits (405 and 406) have the same arrangement, and only the gate driving circuit 406 will be represented.

The operations of the switching elements IGBTs 202 and 201 contained in the voltage resonant converter in FIG. 1 have been described above, and alternate switching operation is done to realize power conversion.

An emitter potential serving as the reference point of the switching elements 201 and 202 is generated by an AC waveform of a very high voltage at the equal potential as the flyback voltage of the coil 203. The switching IGBTs 201 and 202 must be driven while the gate voltages relative to their emitters are insulated.

Of circuits for implementing this insulated driving, an insulated driving method using a transformer is the most effective. This is because the insulated transformer according to this method can obtain a gate-drivable waveform by only transmitting a switching pulse voltage waveform generated by a secondary circuit to a primary circuit via the insulated transformer, and shaping the transmitted waveform without using another power supply in the gate circuit.

Figure 22:
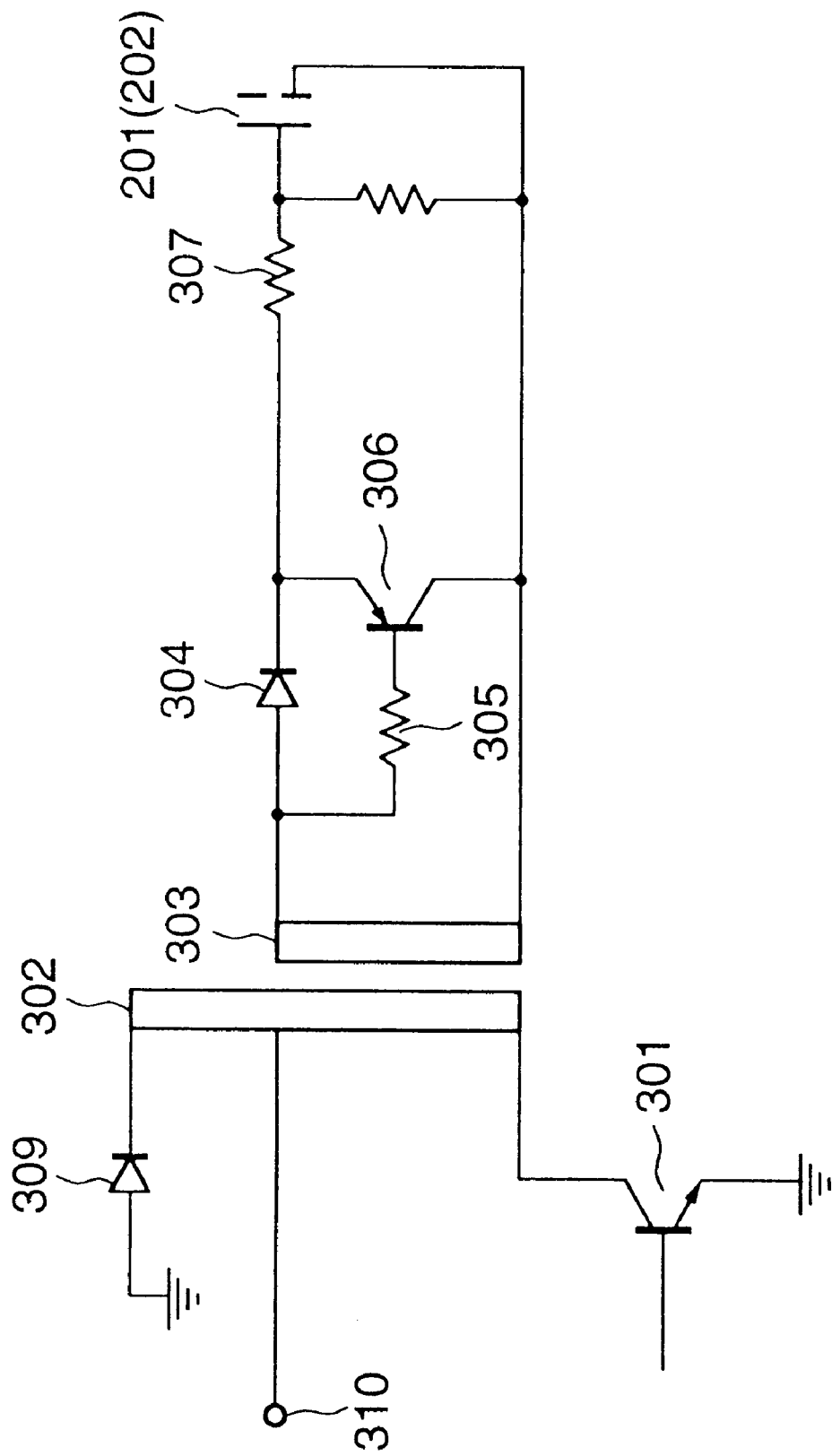
FIG. 22 is a circuit diagram showing an arrangement of a conventional insulated semiconductor driving circuit.

FIG. 22 is a circuit diagram showing an example of a conventional insulated driving circuit. In FIG. 22, reference numeral 301 denotes a driving switching element which transmits a signal to the switching element 201 (202) and of which gate is driven by a pulse width-modulated signal; 302, an exciting winding of the transformer that is insulated from a facing winding 303, and realizes a double insulated structure by the insulation distance or insulation of covering a wire; 304, a rectifying element; 305, a resistor; 306, a switching element for supplying an OFF signal to a power switching semiconductor element gate; 307, a gate resistor defined for each power switching element; 309, a regenerative diode connected to the regenerative winding of the winding 302 to regenerate a current after excitation; and 310, a power supply terminal.

This insulated driving circuit often uses a pulse transformer. The pulse transformer can advantageously transmit and output a voltage waveform and accompanying current, i.e., driving power itself. To the contrary, transmission by a photocoupler or the like requires a DC power supply after transmission, which is disadvantageous in terms of the cost.

However, the voltage waveform transmitted by the transformer suffers a delay (decrease in slew rate), undershoot, and voltage vibrations owing to the leakage inductance of a magnetic flux generated by the structure of the transformer or a voltage vibration phenomenon caused by the mutual capacitance between the windings. The voltage waveform cannot be directly used as a driving signal for the power switching semiconductor.

For this reason, in the conventional circuit, the IGBT 201 (202) is driven via the rectifying element 304 and gate resistor 307 in order to turn on a power switching semiconductor 308 while the pulse transformer is in an excited state and to turn off the power switching semiconductor 308 while the pulse transformer is in an unexcited state. At the same time, the flyback voltage of the transformer is used in the unexcited state to terminate the gate voltage of the power switching semiconductor 308 to the source voltage by the operation of the transistor 306, thereby performing switching-off operation.

However, as described above, the transformer can only transmit a switching-off signal much more moderate than the switching waveform of the transistor 301 driven by the leakage inductance and the stray capacitance of the winding particularly in a trailing waveform due to the characteristics of the transformer itself. The switching loss of the power switching semiconductor increases to increase the heat loss, which makes the thermal design of the device difficult.

To prevent this, the insulated gate driving circuit (405 or 406) in the power supply device shown in FIG. 1 adopts a threshold setting circuit 50 and switching circuit 51 to realize a circuit which solves the above problem.

Figures 19A, 19B, 19C, 19D, 19E, 19F:
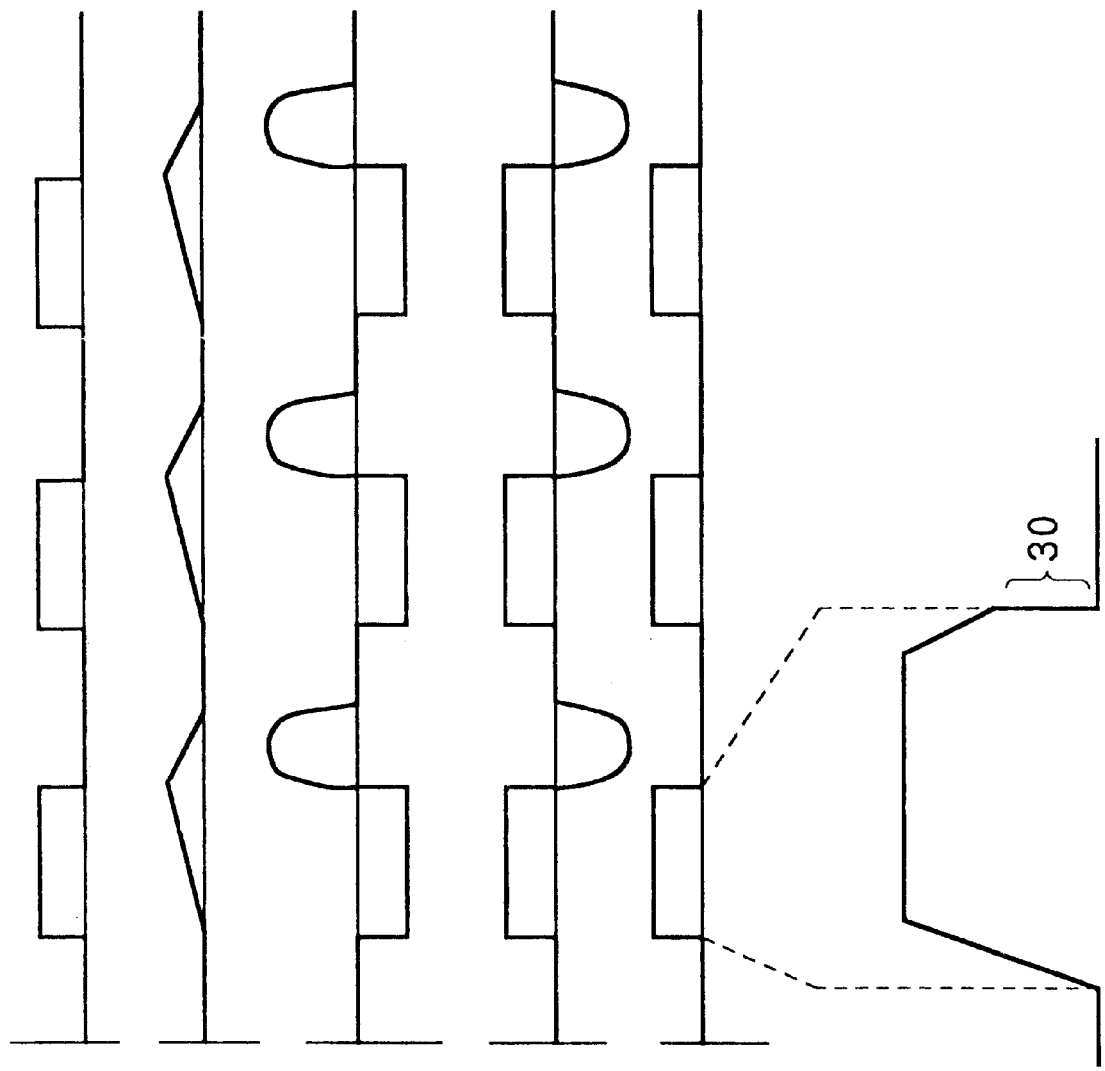
FIGS. 19A to 19F are waveform charts at predetermined positions in the circuit of FIG. 1.

FIGS. 19A to 19F are waveform charts showing operation waveforms at predetermined positions in the insulated driving type gate driving circuit 306. FIG. 19A shows the base driving signal (pulse width-modulated signal) of the switching element 301, FIG. 19B shows the collector current waveform of the element 301, FIG. 19C shows the collector voltage waveform of the element 301, FIG. 19D shows a voltage waveform induced to the transmission winding 303 of the transformer, and FIG. 19E shows the gate driving voltage waveform of the switching IGBT.

When the driver circuit 314 applies a DC voltage to the power supply terminal 310, and supplies a pulse width-modulated signal shown in FIG. 19A, the switching element 301 performs switching operation. As a result, a switching current shown in FIG. 19B flows through the exciting winding 302.

As shown in FIG. 19C, the collector voltage waveform of the switching element 301 at this time is a waveform prepared by differentiating the current waveform (FIG. 19B). An induced voltage shown in FIG. 19D is generated in the transmission winding 303 of the transformer.

The induced voltage is rectified by the rectifying element 304 to obtain a voltage signal having a waveform shown in FIG. 19E.

FIG. 19F shows an enlarged waveform of one pulse waveform in FIG. 19E. In this waveform, a portion 30 at which the voltage abruptly drops is attained by turning on the switching circuit 51 in accordance with a voltage value set by the threshold setting circuit 50 for the drop voltage of a voltage generated in the transmission winding 303. The gate of the power switching IGBT is terminated by the gate resistor 307 to realize gate turn-off operation with a low impedance.

Figure 20:
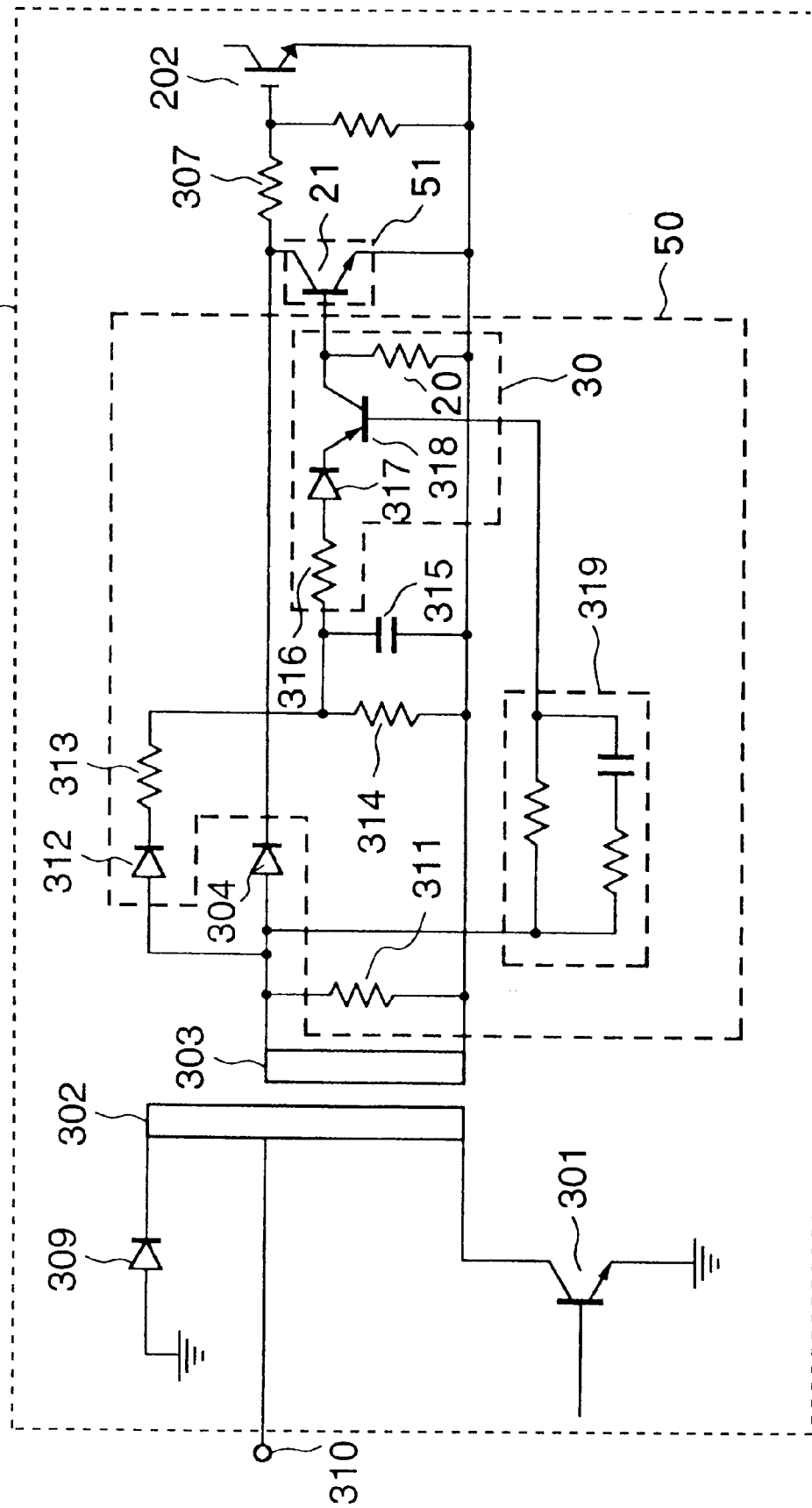
FIG. 20 is a circuit diagram for explaining the circuit of FIG. 1 in more detail.

FIG. 20 is a circuit diagram showing the detailed arrangements of the threshold setting circuit 50 and switching circuit 51 in FIG. 1. The same reference numerals as in FIG. 22 denote the same parts, and a description thereof will be omitted. In FIG. 20, the threshold setting circuit 50 is constituted by a damping resistor 311 of the transformer, diode 312, threshold determination resistors 313 and 314, threshold voltage sampling capacitor 315, CR circuit 319, and edge signal generation circuit 30. The switching circuit 51 is constituted by a switching element 21.

The diode 312 divides the ON voltage of the power switching IGBT via the resistors 313 and 314 serving as threshold voltage determination resistors, thereby charging the sampling capacitor 315. As described above, a voltage having a waveform shown in FIG. 19D is induced in the transmission winding 303. In a pulse rise state, the voltage of a transistor 318 abruptly rises due to the trigger resistance of the base, whereas its emitter rises at a rate attenuated by the threshold determination resistors 313 and 314. As a result, the base and emitter of the transistor 318 are biased in opposite directions, and kept off during rise.

An operation at the trailing edge of the waveform, i.e., operation at time of FIG. 19F will be described. In the leading waveform of a voltage induced in the transmission winding 303, the base of the transistor 318 operates at the same potential because the induced voltage is applied from the CR circuit 319. The sampling capacitor 315 connected to the emitter accumulates a voltage prepared by dividing the ON voltage of the gate by the threshold determination resistors 313 and 314. When the induced voltage of the transmission winding 303 drops to be lower than the voltage of the sampling capacitor 315, the base and emitter of the transistor 318 are forward-biased.

The sampling capacitor 315 then turns on the transistor 318 to turn on the switching element 21 whose base is connected to the collector of the transistor 318.

Accordingly, the output terminals of the transmission winding 303 are short-circuited. The gate of the power switching IGBT is terminated by the gate resistor 307 to rapidly discharge the gate and turn off the IGBT. This can realize a gate voltage waveform shown in FIG. 19F.

The power switching IGBT determines a current response generated particularly in switching an inductive load, the flyback voltage response determines a large current in turning off the power switching IGBT, and high-voltage vibrations determine the ASO (Area of Safe Operation) of the element. Therefore, generating a gate signal as described above can reduce the thermal stress of the switching element to provide a high-efficiency inverter device.

A voltage to be set in the threshold determination circuit 50 should be a value equal to or larger than the upper limit of the gate turn-off voltage of the power switching IGBT.

For example, when the power switching element is an FET, ON operation generally starts around a gate voltage of 4 V, and an ON state exhibiting a sufficient switching ability is attained at about 8 V.

The ratio of the number of turns of the transformer is determined to set the ON voltage value to 16 V, and the ratio of the threshold determination resistors 313 and 314 is set to set the threshold voltage to 8 V. With these settings, a gate voltage in a normal ON state, i.e., 16 V can satisfactorily turn on the gate, and a noise margin can also be sufficiently ensured. The gate potential which abruptly drops from a threshold of 8 V in turning off the IGBT quickly shifts the power switching IGBT to an OFF state. Resultantly, a power switching element with a very small loss can be implemented.

(Second Embodiment)

Figure 21:
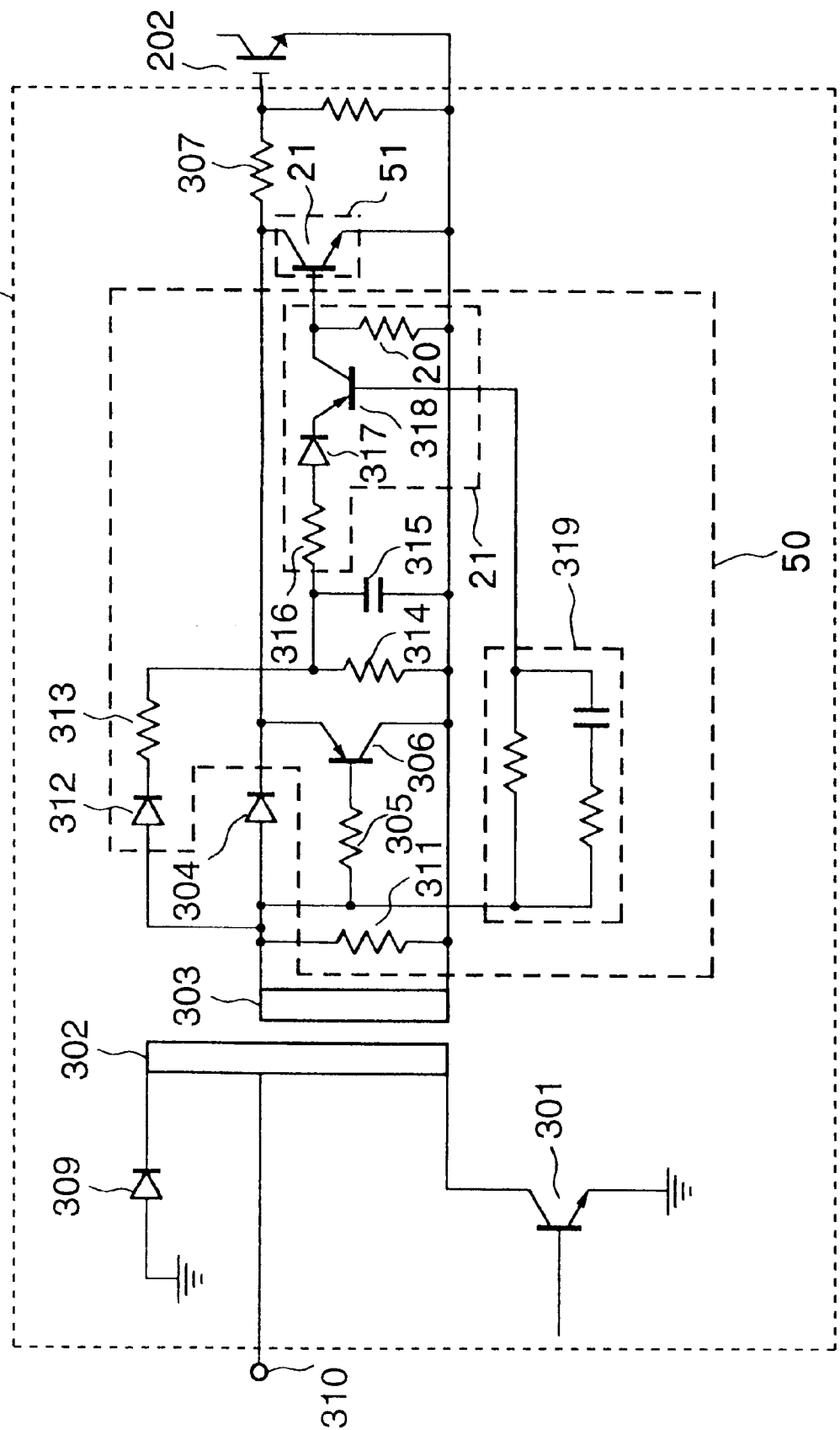
FIG. 21 is a circuit diagram showing an arrangement of an insulated gate driving circuit according to the second embodiment of the present invention.

FIG. 21 is a circuit diagram showing an arrangement of an insulated gate driving circuit 406 in a power supply device according to the second embodiment of the present invention. In FIG. 21, the same reference numerals as in FIG. 20 denote the same parts, and a description thereof will be omitted. In the second embodiment, the circuit arrangement of a power resonant converter 407 is the same as in the first embodiment, and a description thereof will be omitted.

The circuit according to the second embodiment is different from the circuit according to the first embodiment shown in FIG. 1 in that a resistor 305 and switching element 306 are added.

When a power switching IGBT is OFF, the switching element 320 uses a flyback voltage (negative voltage region in the waveform of FIG. 19D) generated in a transmission winding 303, and forward-biases the base voltage of the added switching element 306 to turn on the switching element 306 while keeping the power switching IGBT OFF. This arrangement can generate a more ideal gate pulse.

The above embodiments have exemplified only a case wherein the power switching IGBT element is used as an element to be driven. However, an insulated gate driving circuit according to the present invention can be used to drive an arbitrary switching element.

Effects of the Invention

As has been described above, according to a power supply device of the present invention, a voltage resonant converter comprises a switching IGBT 201 connected to a power supply, a first resonant capacitor 204 series-connected to the switching IGBT 201, a main switching IGBT 202 series-connected to the first resonant capacitor 204, an exciting coil 18 connected between the power supply and a node between the first resonant capacitor 204 and the main switching IGBT 202, a second resonant capacitor 205 parallel-connected to the main switching IGBT 202, and regenerative diodes 206 and 207 respectively parallel-connected to the switching IGBT 201 and main switching IGBT 202. This power supply device has the following operations and effects.

To realize on-demand fixing of heating a fixing belt (metal film) by a magnetic induction heating/fixing method, a voltage resonant power supply is adopted for a high-frequency power supply. Moreover, a switching element is series-connected to a voltage resonant capacitor, and the switching element and main switching IGBT are alternately switched. This can solve a narrow output control width which is a drawback of a conventional voltage resonant power supply, and can minimize the switching loss in control.

More specifically, a voltage resonant type power supply used in the magnetic induction heating/fixing apparatus for heating the fixing belt (metal film) by the magnetic induction heating/fixing method can realize a soft switching arrangement capable of changing output power from the maximum output value to zero without any burden on a semiconductor mounted in the power supply. By widening the control width of fixing power, margins for the temperature control precision and input voltage range can be assured. Compared to strict management of the resonant cycle in the conventional voltage resonant capacitor, element selection can realize a power supply arrangement with a relatively wide latitude. This will be summarized as follows in terms of items.

(1) The thermal time constant of the fixing device can be suppressed low in realizing on-demand fixing. The power control linearity and control response are very important for the speed of the thermal response. Since the output control width can be continuously changed from almost zero to the maximum output, the real worth of the fixing device is proved with the use of existing PID (Proportional plus Integral plus Derivative) control or the like for feedback control.

(2) The power supply employs a combination of two resonant states (low-frequency resonance and high-frequency resonance) from the contents of the operation described above, so that the voltage waveform can be set to an intermediate waveform between a sine wave and a rectangular wave. Compared to a conventional voltage resonant waveform (sine half-wave), the waveform ratio of the maximum value to the effective voltage value can be reduced to suppress the breakdown voltage of the switching element low.

(3) The gist of the circuit method is to reduce a loss caused by resonant vibrations with a high damping coefficient within a short time in switching. The allowable switching timing range is wide, variations owing to combinations of components can be flexibly coped with, and the possibility and productivity can be increased.

(4) The use of the resonant method can suppress the switching loss and switching noise small regardless of using large power.

In addition, the power supply device according to the present invention compares, of driving voltage pulses, a gate turn-off voltage in switching-off operation with a preset voltage, and drives the switching element using insulated gate driving circuits 405 and 406 which make the voltage abruptly fall when the voltage reaches the set voltage. From this, the power supply device attains the following effects:

1. Since the gate is abruptly discharged at a threshold or less, the gate current is suppressed to the minimum gate transient current, and does not damage the switching element to be driven.
2. Charges accumulated in the gate of the switching element to be driven can be quickly removed, and this discharge responds faithfully to a pulse width-modulated signal as a control signal. Thus, the power control linearity as a final output can be easily ensured.
3. Since high-speed turn-off switching can be realized with a small loss, the thermal design is simplified, which is very effective for an apparatus such as a printer apparatus to which a primary circuit and double insulation structure are required.

Note that the present invention can be applied to a system constituted by a plurality of devices or an apparatus constituted by one device. The first and second embodiments of the present invention have exemplified a case wherein the power supply device of the present invention is mounted in a color printer serving as an image forming apparatus. However, the present invention is not limited to this, and can also be applied to an image forming apparatus which mounts a fixing device using the power supply device of the present invention.

Furthermore, the present invention can be applied to the system comprising either a plurality of units or a single unit. It is needless to say that the present invention can be applied to the case which can be attained by supplying programs which execute the process defined by the present system or invention.

As many apparently widely different embodiments of the present invention can be made without departing from the spirit and scope thereof, it is to be understood that the invention is not limited to the specific embodiments thereof except as defined in the appended claims.

What is claimed is:

1. A power supply device used in an image forming apparatus, comprising:
    a first IGBT (Insulated Gate Bipolar Transistor) connected to a power supply;
    first electricity accumulation means series-connected to said first IGBT;
    a second IGBT series-connected to said first electricity accumulation means;
    magnetic field generation means connected between the power supply and a node between said first electricity accumulation means and said second IGBT;
    second electricity accumulation means parallel-connected to said second IGBT;
    first rectifying means parallel-connected to said first IGBT;
    voltage resonant converter means having second rectifying means parallel-connected to said second IGBT; and
    insulated driving circuit means for shaping a waveform of a transmission voltage transmitted via an output terminal of an insulated transformer, and outputting the transmission voltage as a driving voltage for driving gates of said first and second IGBTs,
    said insulated driving circuit means having:
        threshold voltage generation means for generating a preset threshold voltage;
        detection means for detecting that the transmission voltage becomes lower than the threshold voltage when the transmission voltage drops; and
        first switching means for short-circuiting output terminals of the insulated transformer in response to the detection.

2. The device according to claim 1, wherein said threshold voltage generation means generates the threshold voltage using the transmission voltage.

3. The device according to claim 2, wherein said detection means comprises capacitor means charged by the threshold voltage, and control signal generation means for generating a signal which turns on said first switching means when the transmission voltage becomes lower than a voltage of said capacitor means.

4. The device according to claim 1, characterized by further comprising second switching means which is turned on by a flyback voltage of the insulated transformer to short-circuit the output terminals.

5. The device according to claim 1, wherein said first IGBT and said second IGBT alternately perform switching.

6. An image forming apparatus, comprising:
    image forming means for forming an image;
    a heater for heat fixing the image; and
    a power supply device according to claim 1, for supplying power to said heater.

7. An image forming apparatus according to claim 6, wherein said image forming means is electrophotographic and the power supply device supplies power to a fixing device.

8. A fixing device for use in an image forming apparatus comprising:
    a heater; and
    a power supply device as defined in claim 1 for said heater.

9. A driving circuit for a power semiconductor switching device comprising:
    a transformer;
    a first switching circuit connected to a primary winding of said transformer;
    a rectifier element for rectifying an output from said transformer and for generating a signal for switching said power semiconductor switching device;
    a threshold setting circuit for setting a threshold voltage; and
    a second switching circuit for short-circuiting the output of said rectifier element based on the output of the transformer and the threshold voltage set by said threshold setting circuit.

10. A driving circuit according to claim 9, wherein said power semiconductor switching device is IGBT.

11. A driving circuit according to claim 9, wherein said second switching circuit short-circuits output of said rectifier element, when the output of the transformer becomes lower than the threshold voltage set by said threshold setting circuit.

12. A driving circuit according to claim 9, wherein said threshold setting circuit generates the threshold voltage based on the output of the transformer.

13. A driving circuit according to claim 12, wherein said threshold setting circuit comprises a capacitor charged to the threshold voltage, said driving circuit further comprises a comparison circuit for comparing the threshold voltage of said capacitor with the output of the transformer, and said second switching circuit is short-circuited when the voltage of the secondary winding of the transformer becomes lower than the threshold voltage.

14. A driving circuit according to claim 9, further comprising:
 a third switching circuit for short-circuiting the output terminals of said transformer; and
 wherein said third switching circuit is turned on by a fly-back voltage of said transformer.

15. A power supply device for providing electric power to an exciting coil comprising:
 a voltage resonant converting circuit including a power semiconductor switching device; and
 a driving circuit for driving said power semiconductor switching device, wherein said driving circuit comprises:
 a transformer;
 a first switching circuit connected to a primary winding of said transformer;
 a rectifier element for rectifying an output from said transformer and for generating a signal for switching said power semiconductor switching device;
 a threshold setting circuit for setting a threshold voltage; and
 a second switching circuit for short-circuiting the output of said rectifier element based on the output of the transformer and the threshold voltage set by said threshold setting circuit.

16. A power supply device according to claim 15, wherein said voltage resonant converting circuit comprising a first and second power semiconductor switching devices, and said power supply device comprising a first and second driving circuits for driving said first and second power semiconductor switching devices, respectively.

17. A power supply device according to claim 16, wherein said voltage resonant converting circuit further comprises:
 a first capacitor series-connected between said first and second power semiconductor switching devices;
 a first rectifying means parallel-connected to said first power semiconductor switching devices;
 a second capacitor parallel-connected to said second power semiconductor switching device; and
 a second rectifying means parallel-connected to said second power semiconductor switching device, and
 wherein said exciting coil is connected between one terminal of said first power semiconductor switching device and one terminal of said second power semiconductor switching device.

18. A power supply device according to claim 15, wherein said power semiconductor switching device is IGBT.

19. A power supply device according to claim 15, wherein said second switching circuit short-circuits output of said rectifier element, when the output of the transformer becomes lower than the threshold voltage set by said threshold setting circuit.

20. A power supply device according to claim 15, wherein said threshold setting circuit generates the threshold voltage based on the output of the transformer.

21. A power supply device according to claim 20, wherein said threshold setting circuit comprises a capacitor charged to the threshold voltage, said driving circuit further comprises a comparison circuit for comparing the threshold voltage to said capacitor with the output of the transformer, and said second switching circuit is short-circuited when the voltage of the secondary winding of the transformer becomes lower than the threshold voltage.

22. A power supply device according to claim 15, said driving circuit further comprising:
 a third switching circuit for short-circuiting the output terminals of said transformer; and
 wherein said third switching circuit is turned on by a fly-back voltage of said transformer.

23. A fixing device comprising:
 an electromagnetic induction heating member;
 an exciting coil for generating a magnetic flux inducing eddy currents in said electromagnetic induction heating member;
 a voltage resonant converting circuit, including a power semiconductor switching device, for providing electric power to said exciting coil; and
 a driving circuit for driving said power semiconductor switching device,
 wherein said driving circuit comprises:
 a transformer;
 a first switching circuit connected to a primary winding of said transformer;
 a rectifier element for rectifying an output from said transformer and for generating a signal for switching said power semiconductor switching device;
 a threshold setting circuit for setting a threshold voltage; and
 a second switching circuit for short-circuiting the output of said rectifier element based on the output of the transformer and the threshold voltage set by said threshold setting circuit.

24. A fixing device according to claim 23, wherein said voltage resonant converting circuit comprising a first and second power semiconductor switching devices, and said power supply device comprising a first and second driving circuits for driving said first and second power semiconductor switching devices, respectively.

25. A fixing device according to claim 24, wherein said voltage resonant converting circuit further comprises:
 a first capacitor series-connected between said first and second power semiconductor switching devices;
 a first rectifying means parallel-connected to said first power semiconductor switching devices;
 a second capacitor parallel-connected to said second power semiconductor switching device; and
 a second rectifying means parallel-connected to said second power semiconductor switching device, and
 wherein said exciting coil is connected between one terminal of said first power semiconductor switching device and one terminal of said second power semiconductor switching device.

26. A fixing device according to claim 23, wherein said power semiconductor switching device is IGBT.

27. A fixing device according to claim 23, wherein said second switching circuit short-circuits output of said rectifier element, when the output of the transformer becomes lower than the threshold voltage set by said threshold setting circuit.

28. A fixing device according to claim 23, wherein said threshold setting circuit generates the threshold voltage based on the output of the transformer.

29. A fixing device according to claim 28, wherein said threshold setting circuit comprises a capacitor charged to the threshold voltage, said driving circuit further comprises a comparison circuit for comparing the threshold voltage of said capacitor with the output of the transformer, and said second switching circuit is short-circuited when the voltage of the secondary winding of the transformer becomes lower than the threshold voltage.

30. A fixing device according to claim 23, wherein said driving circuit further comprises:
 a third switching circuit for short-circuiting the output terminals of said transformer; and
 wherein said third switching circuits is turned on by a fly-back voltage of said transformer.

31. An image forming apparatus comprising:
 an image forming means for forming a toner image on a printing medium according to an electrophotographic method;
 a voltage resonant converting circuit having an electromagnetic induction heating member, an exciting coil for generating magnetic flux to induce eddy currents in said electromagnetic induction heating member, and a power semiconductor switching device; and
 a fixing device for heat-fixing said toner image formed on the printing medium and comprising a driving circuit for driving said power semiconductor switching device,
 wherein said driving circuit comprises:
  a transformer;
  a first switching circuit connected to a primary winding of said transformer;
  a first rectifier element for rectifying an output from said transformer and for generating a signal for switching said power semiconductor switching device;
  a threshold setting circuit for setting a threshold voltage; and
  a second switching circuit for short-circuiting the output of said rectifier element based on the output of the transformer and the threshold voltage set by said threshold setting circuit.

* * * * *

UNITED STATES PATENT AND TRADEMARK OFFICE
CERTIFICATE OF CORRECTION

PATENT NO. : 6,373,232 B1 Page 1 of 1
DATED : April 16, 2002
INVENTOR(S) : Hiroshi Mano et al.

It is certified that error appears in the above-identified patent and that said Letters Patent is hereby corrected as shown below:

Column 23,
Line 3, "element low." should read -- element. --.
Line 11, "small" should be deleted.

Column 24,
Line 30, "characterized by" should be deleted.

Column 25,
Line 43, "comprising a" should read -- comprises --.
Line 45, "comprising a" should read -- comprises --.

Column 26,
Line 44, "comprising a" should read -- comprises --.
Line 46, "comprising a" should read -- comprises --.

Column 27,
Line 19, "circuits" should read -- circuit --.

Signed and Sealed this

Ninth Day of July, 2002

*Attest:*

JAMES E. ROGAN
*Attesting Officer*     *Director of the United States Patent and Trademark Office*